US011563001B2

(12) United States Patent
Huang et al.

(10) Patent No.: US 11,563,001 B2
(45) Date of Patent: Jan. 24, 2023

(54) AIR SPACER AND CAPPING STRUCTURES IN SEMICONDUCTOR DEVICES

(71) Applicant: Taiwan Semiconductor Manufacturing Co., Ltd., Hsinchu (TW)

(72) Inventors: Lin-Yu Huang, Hsinchu (TW); Chiao-Hao Chang, Hsinchu (TW); Cheng-Chi Chuang, New Taipei (TW); Chih-Hao Wang, Baoshan Township (TW); Ching-Wei Tsai, Hsinchu (TW); Kuan-Lun Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 120 days.

(21) Appl. No.: 17/006,167

(22) Filed: Aug. 28, 2020

(65) Prior Publication Data

US 2021/0305246 A1 Sep. 30, 2021

Related U.S. Application Data

(60) Provisional application No. 63/002,036, filed on Mar. 30, 2020.

(51) Int. Cl.
*H01L 27/088* (2006.01)
*H01L 29/66* (2006.01)
*H01L 29/423* (2006.01)

(52) U.S. Cl.
CPC .... *H01L 27/0886* (2013.01); *H01L 29/42392* (2013.01); *H01L 29/6653* (2013.01); *H01L 29/66795* (2013.01)

(58) Field of Classification Search
CPC ......... H01L 29/42392; H01L 29/66795; H01L 29/785; H01L 29/0649; H01L 29/4991; H01L 27/0886
See application file for complete search history.

(56) References Cited

U.S. PATENT DOCUMENTS 9,105,490 B2 8/2015 Wang et al.
9,236,267 B2 1/2016 De et al.
(Continued)

FOREIGN PATENT DOCUMENTS

KR 20140012443 A 2/2014
KR 20180068846 A 6/2018
(Continued)

OTHER PUBLICATIONS

Office Action directed to related Korean Application No. 1020200165635, dated Sep. 20, 2022; 8 pages.
(Continued)

*Primary Examiner* — Tuan A Hoang
(74) *Attorney, Agent, or Firm* — Sterne, Kessler, Goldstein & Fox P.L.L.C.

(57) ABSTRACT

A semiconductor device with air spacers and air caps and a method of fabricating the same are disclosed. The semiconductor device includes a substrate and a fin structure disposed on the substrate. The fin structure includes a first fin portion and a second fin portion. The semiconductor device further includes a source/drain (S/D) region disposed on the first fin portion, a contact structure disposed on the S/D region, a gate structure disposed on the second fin portion, an air spacer disposed between a sidewall of the gate structure and the contact structure, a cap seal disposed on the gate structure, and an air cap disposed between a top surface of the gate structure and the cap seal.

20 Claims, 23 Drawing Sheets

(56) References Cited

U.S. PATENT DOCUMENTS

| | | | |
|---|---|---|---|
| 9,236,300 B2 | 1/2016 | Liaw | |
| 9,263,392 B1* | 2/2016 | Lin | H01L 21/76897 |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 10,504,782 B2 | 4/2019 | Suen et al. | |
| 10,510,861 B1 | 12/2019 | Yeh et al. | |
| 10,861,952 B2 | 12/2020 | Ching et al. | |
| 11,211,286 B2 | 12/2021 | Pal et al. | |
| 2013/0248950 A1* | 9/2013 | Kang | H01L 29/66545 257/288 |
| 2014/0024192 A1 | 1/2014 | Kim et al. | |
| 2016/0365426 A1* | 12/2016 | Ching | H01L 29/6656 |
| 2017/0141207 A1 | 5/2017 | Cheng et al. | |
| 2018/0166553 A1 | 6/2018 | Lee et al. | |
| 2020/0006158 A1 | 1/2020 | Chen et al. | |
| 2020/0027959 A1 | 1/2020 | Cheng et al. | |
| 2021/0098592 A1* | 4/2021 | Kang | H01L 29/66545 |

FOREIGN PATENT DOCUMENTS

| | | |
|---|---|---|
| TW | 201916257 A | 4/2019 |
| TW | 201941363 A | 10/2019 |
| TW | 201946126 A | 12/2019 |
| TW | 202002025 A | 1/2020 |
| TW | 202002028 A | 1/2020 |

OTHER PUBLICATIONS

Office Action directed to related Taiwanese Application No. TW11120970390, dated Oct. 4, 2022; 11 pages.

* cited by examiner

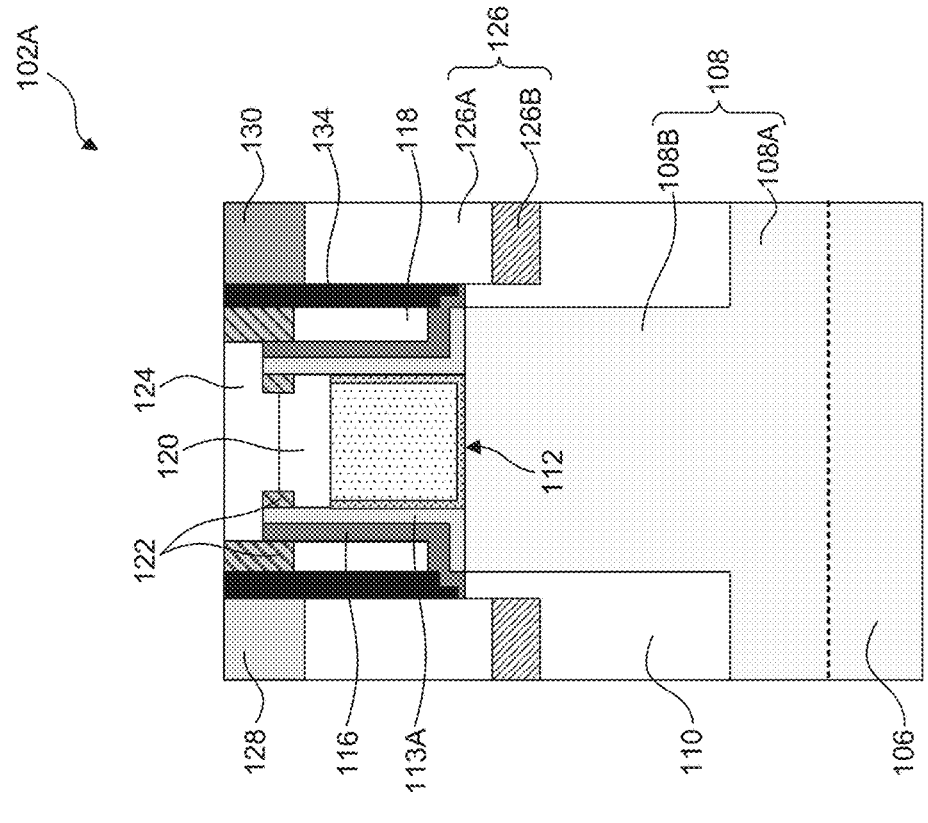
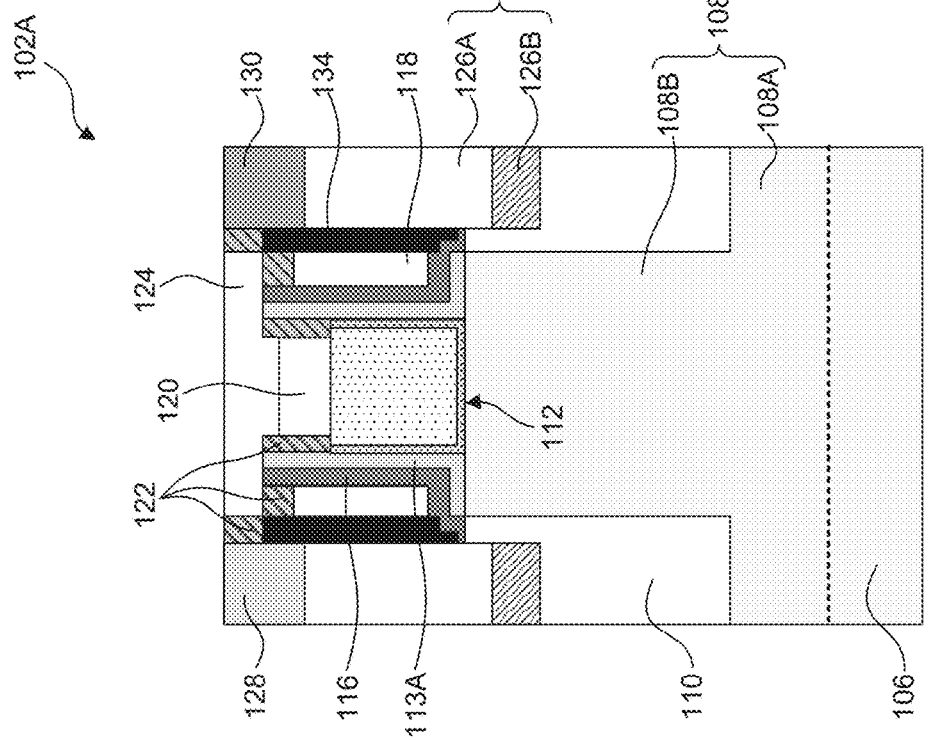
Fig. 1E
Fig. 1D

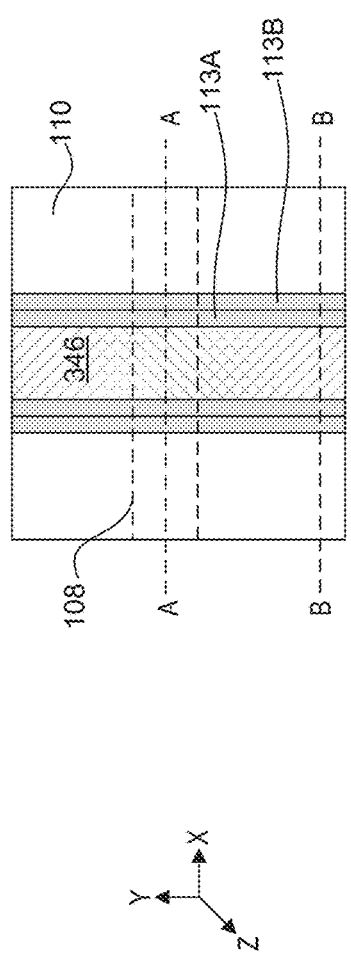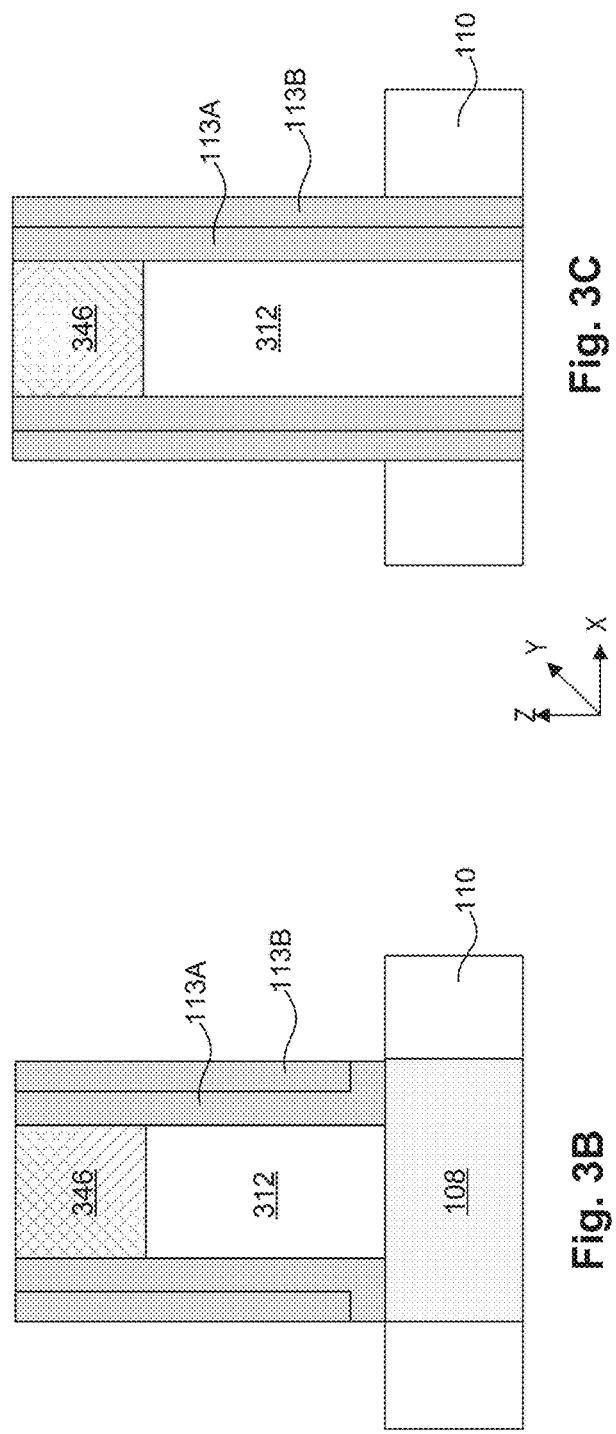

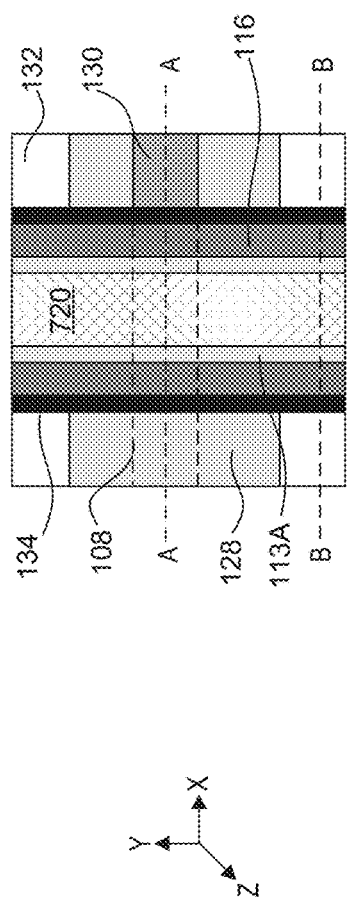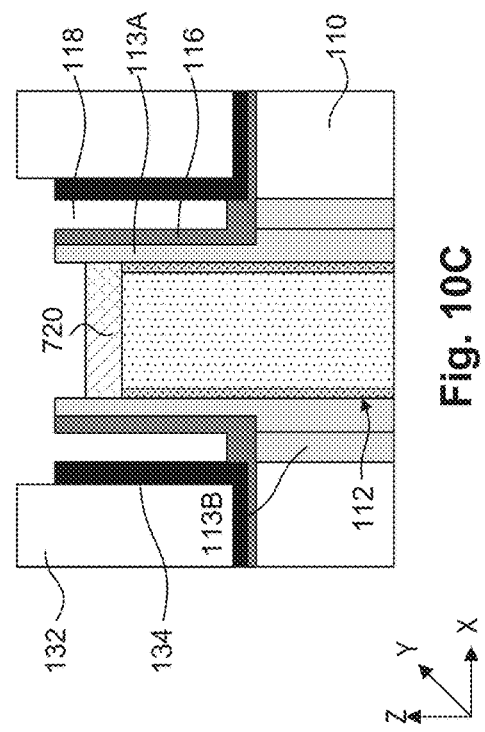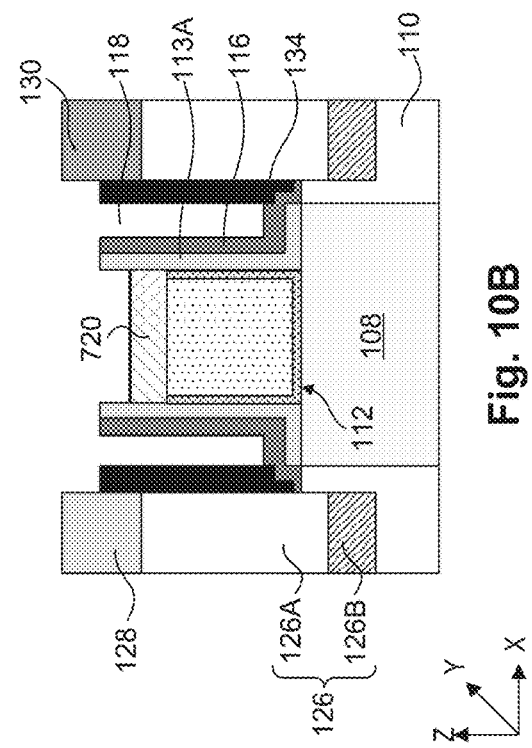

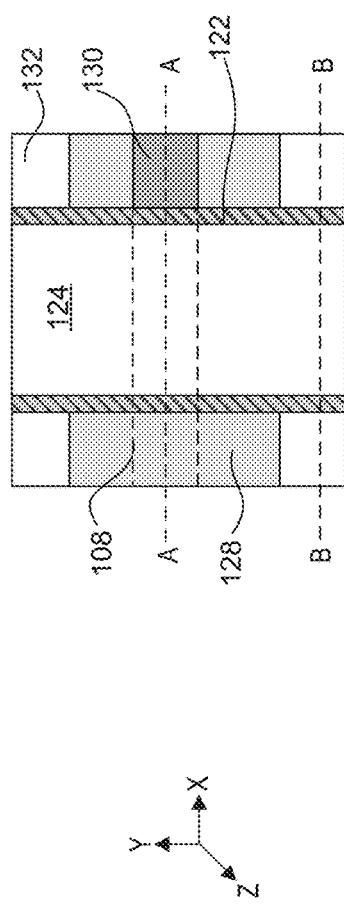
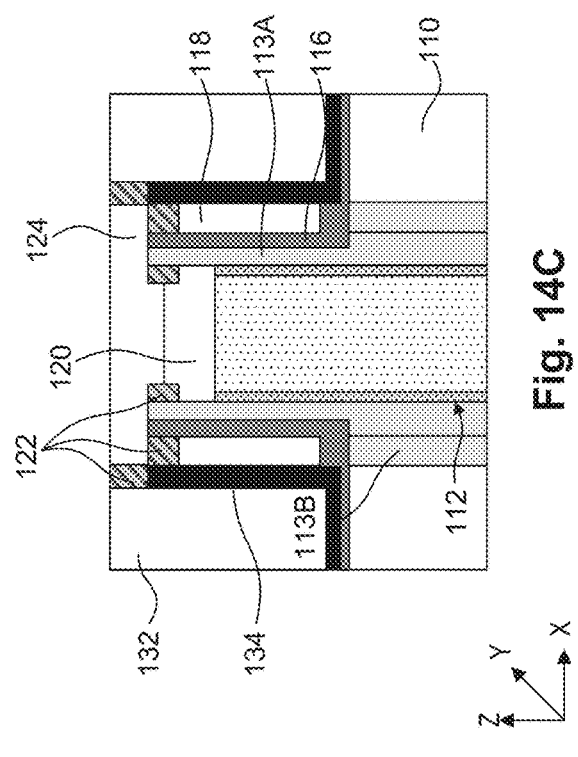
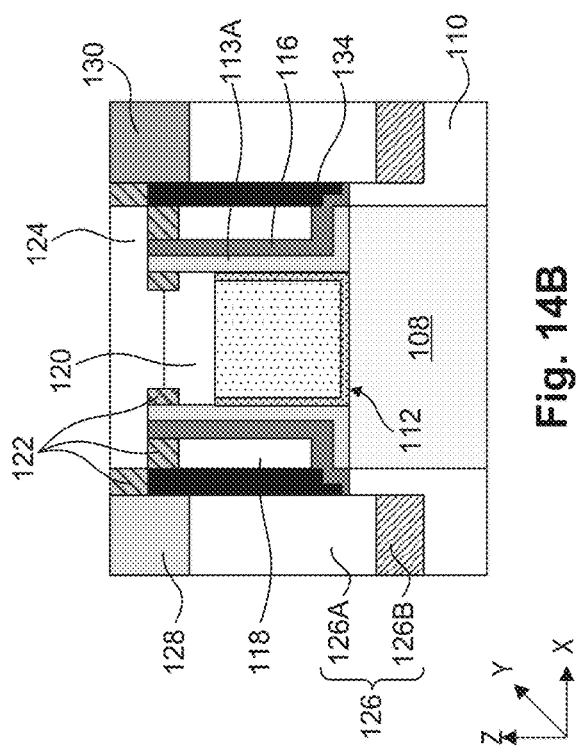

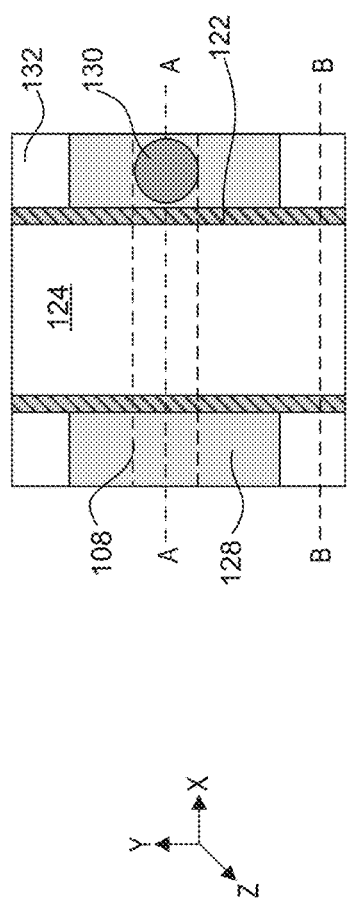
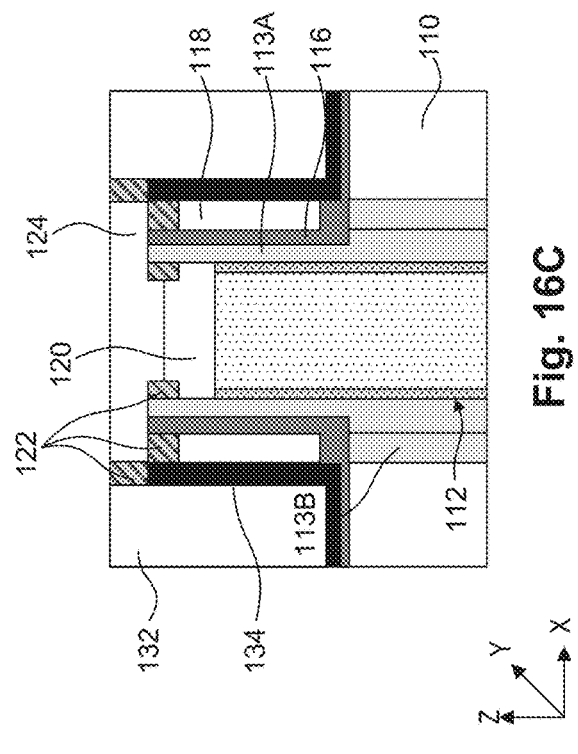
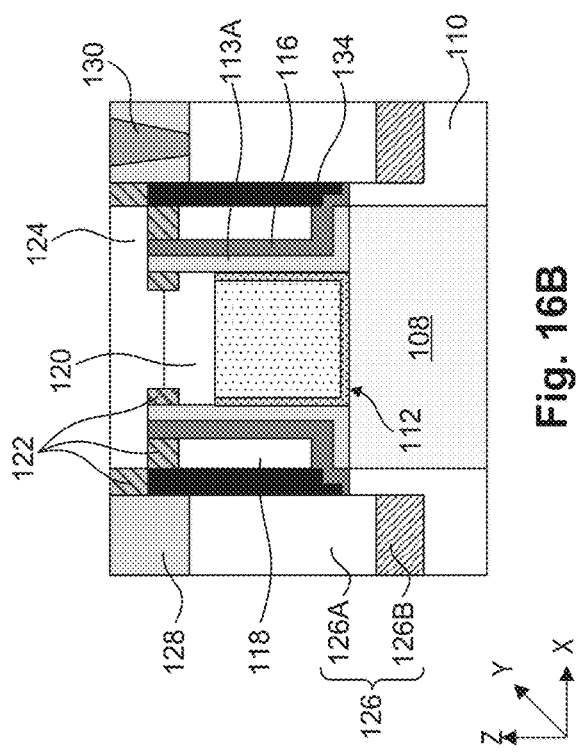
Fig. 16A
Fig. 16B
Fig. 16C

AIR SPACER AND CAPPING STRUCTURES IN SEMICONDUCTOR DEVICES

CROSS-REFERENCE TO RELATED APPLICATIONS

This application claims the benefit of U.S. Provisional Patent Application No. 63/002,036 titled "Isolation structures of Semiconductor Devices," filed Mar. 30, 2020, the disclosure of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

FIGS. 1B-1I illustrate cross-sectional views a semiconductor device with air spacer and capping structures, in accordance with some embodiments.

FIGS. 3A-18C illustrate top views and cross-sectional views of a semiconductor device with air spacer and capping structures at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
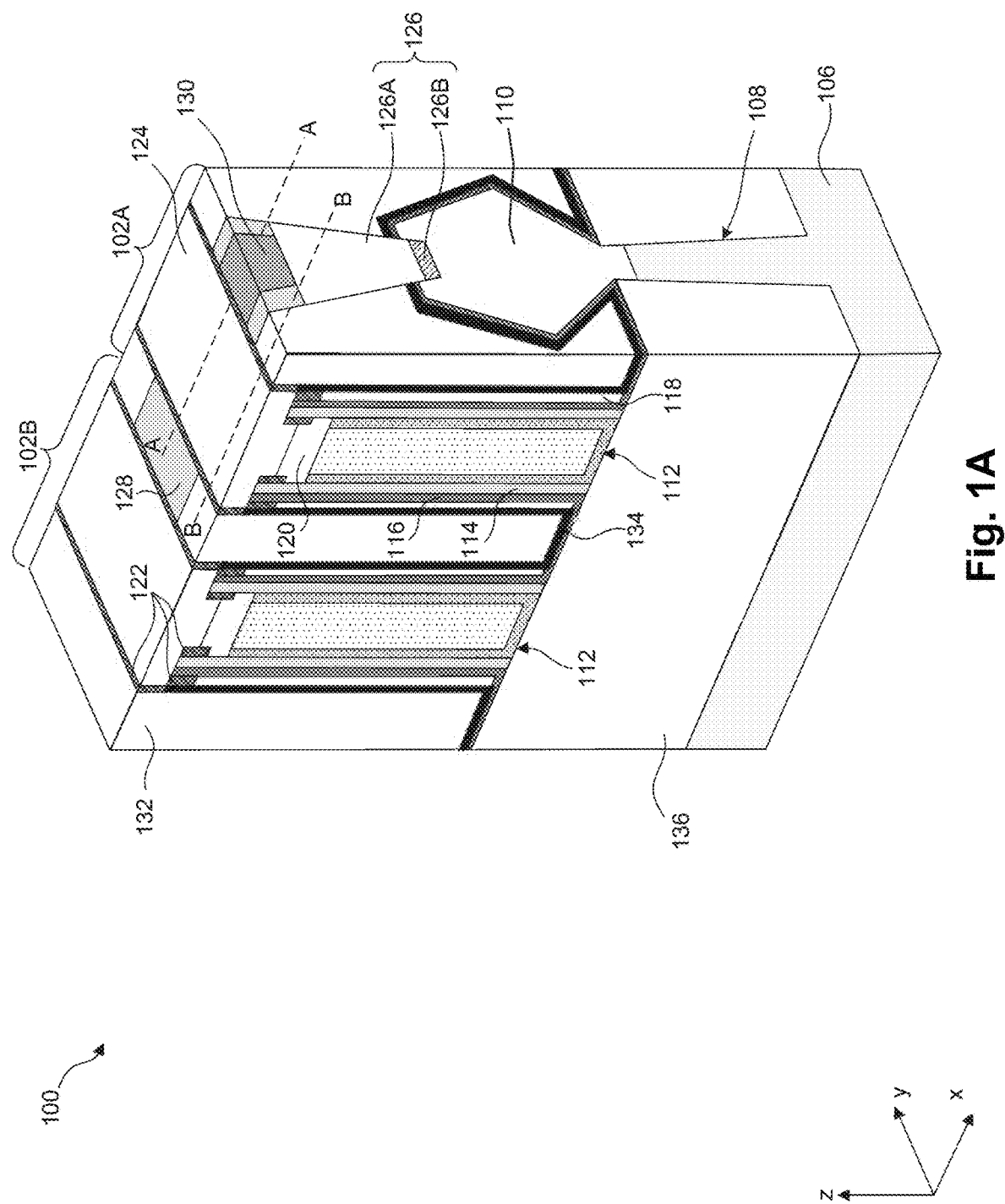
FIG. 1A illustrates an isometric view a semiconductor device with air spacer and capping structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

As used herein, the term "nanostructured" defines a structure, layer, and/or region as having a horizontal dimension (e.g., along an X- and/or Y-axis) and/or a vertical dimension (e.g., along a Z-axis) less than, for example, 100 nm.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The reliability and performance of semiconductor devices with FETs (e.g., finFETs or GAA FETs) have been negatively impacted by the scaling down of semiconductor devices. The scaling down has resulted in smaller electrical isolation regions (e.g., spacers and capping structures) between gate structures and source/drain (S/D) contact structures and/or between gate structures and interconnect structures. Such smaller electrical isolation regions may not adequately reduce parasitic capacitance between the gate structures and the S/D contact structures and/or between the gate structures and the interconnect structures. Further, the smaller electrical isolation regions may not adequately prevent current leakage between the gate structures and the S/D contact structures and/or between the gate structures and the interconnect structures, which can lead to degradation of the semiconductor device reliability and performance.

The present disclosure provides example semiconductor devices with FETs (e.g., finFETs or GAA FETs) having air spacers and air caps and provides example methods of forming such semiconductor devices. In some embodiments, the air spacers can be disposed between the sidewalls of the gate structures and the S/D contact structures and can extend along the width of the gate structures. In some embodiments, the air caps can be disposed between the conductive structures (e.g., metal lines and/or metal vias) of the interconnect structures and the underlying top surfaces of the gate structures. The air spacers and air caps provide electrical isolation between the gate structures and the S/D contact structures and/or between the gate structures and the interconnect structures with improved device reliability and performance. The low dielectric constant of air in air spacers and air caps can reduce the parasitic capacitance by about 20% to about 50% compared to semiconductor devices without air spacers and air caps. Further, the presence of air spacers and air caps minimizes current leakage paths between the gate structures and the S/D contact structures and/or between the gate structures and the interconnect structures. Reducing the parasitic capacitance and/or current leakage in the semiconductor devices can improve the device reliability and performance compared to semiconductor devices without air spacers and air caps.

Figures 1B, 1C:
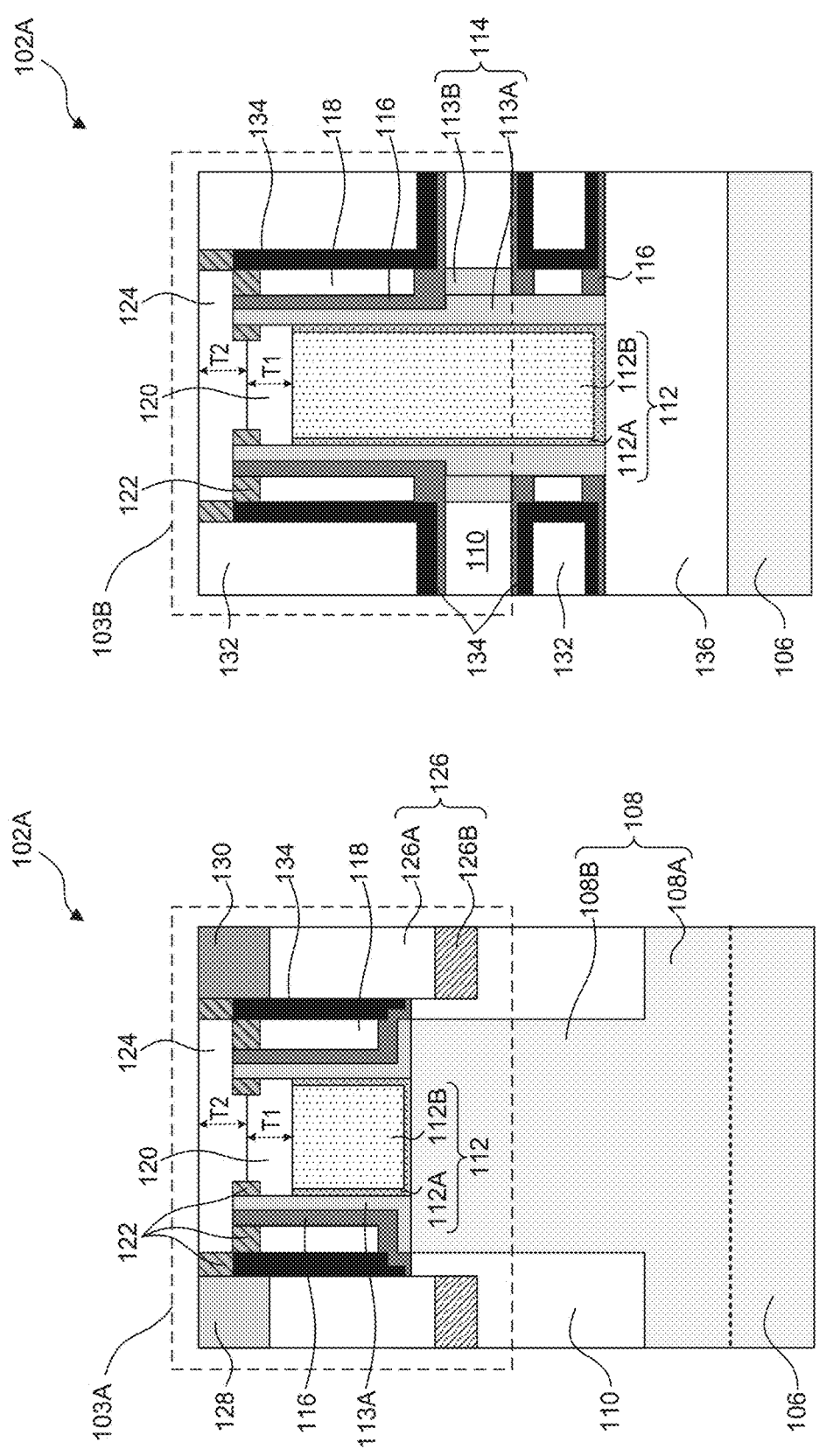

A semiconductor device 100 having FETs 102A-102B is described with reference to FIGS. 1A-1I, according to some embodiments. FIG. 1A illustrates an isometric view of semiconductor device 100, according to some embodiments. FIG. 1B and FIG. 1C illustrate cross-sectional views along respective lines A-A and B-B of semiconductor device 100 of FIG. 1A, according to some embodiments. Semiconductor device 100 can have different cross-sectional views along line A-A of FIG. 1A as illustrated in FIGS. 1B and 1D-1I, according to various embodiments. The discussion of elements in FIGS. 1A-1I with the same annotations applies to each other, unless mentioned otherwise. The discussion of FET 102A applies to FET 102B, unless mentioned otherwise. FETs 102A-102B can be n-type, p-type, or a combination thereof.

Semiconductor device 100 can be formed on a substrate 106. Substrate 106 can be a semiconductor material, such as silicon, germanium (Ge), silicon germanium (SiGe), silicon carbide (SiC), gallium arsenide (GaAs), gallium phosphide (GaP), indium phosphide (InP), indium arsenide (InAs), silicon germanium carbide (SiGeC), and a combination thereof. Further, substrate 106 can be doped with p-type dopants (e.g., boron, indium, aluminum, or gallium) or n-type dopants (e.g., phosphorus or arsenic).

Referring to FIGS. 1A-1C, FET 102A can include (i) a fin structure 108 extending along an X-axis, (ii) a gate structure 112 extending along a Y-axis, (iii) epitaxial regions 110, (iv) inner spacers 114 having first and second inner spacers 113A-113B, (v) outer spacers 116, (vi) air spacers 118, (vii) air cap 120, (viii) air spacer seals 122, (ix) air cap seal 124, (x) source/drain (S/D) contact structures 126, (xi) S/D capping layer 128, and (xii) via structure 130. Fin structure 108 can include fin recessed regions 108A underlying epitaxial regions 110 and a fin raised region 108B underlying gate structure 112. In some embodiments, fin structure 108 can include a material similar to substrate 106.

Epitaxial regions 110 can be grown on fin recessed regions 108A and can be S/D regions of FET 102A. Epitaxial regions 110 can include epitaxially-grown semiconductor material that can include the same material or a different material from the material of substrate 106. Epitaxial regions 110 can be p- or n-type. In some embodiments, n-type epitaxial regions 110 can include SiAs, SiC, or SiCP and p-type epitaxial regions 110 can include SiGe, SiGeB, GeB, SiGeSnB, a III-V semiconductor compound, or a combination thereof.

S/D contact structures 126 can be disposed on epitaxial regions 110 and can be configured to electrically connect epitaxial regions 110 to other elements of FET 102A and/or of the integrated circuit (not shown) through via structure 130. In some embodiments, via structure 130 can be disposed on one of S/D contact structures 126 and S/D capping layer 128 can be disposed on another of S/D contact structures 126. S/D capping layer 128 can electrically isolate S/D contact structure 126 from other overlying elements of FET 102A. Each of S/D contact structures 126 can include a S/D contact plug 126A and a silicide layer 126B. S/D contact plugs 126A can include conductive materials, such as ruthenium (Ru), iridium (Ir), nickel (Ni), Osmium (Os), rhodium (Rh), Al, molybdenum (Mo), tungsten (W), cobalt (Co), and copper (Cu). In some embodiments, via structure 130 can include conductive materials, such as Ru, Co, Ni, Al, Mo, W, Ir, Os, Cu, and Pt.

In some embodiments, S/D capping layer 128 can include dielectric materials, such as silicon nitride (SiN), zirconium silicide (ZrSi), silicon carbon nitride (SiCN), zirconium aluminum oxide (ZrAlO), titanium oxide ($TiO_2$), tantalum oxide ($Ta_2O_5$), zirconium oxide ($ZrO_2$), lanthanum oxide ($La_2O_3$), zirconium nitride (ZrN), silicon carbide (SiC), zinc oxide (ZnO), silicon oxycarbide (SiOC), hafnium oxide ($HfO_2$), aluminum oxide ($Al_2O_3$), silicon oxycarbonitride (SiOCN), Si, hafnium silicide ($HfSi_2$), aluminum oxynitride (AlON), yttrium oxide ($Y_2O_3$), tantalum carbon nitride (TaCN), and silicon oxide ($SiO_2$). In some embodiments, S/D capping layer 128 can have a thickness along a Z-axis in a range from about 1 nm to about 50 nm. Below this range of thickness, S/D capping layer 128 may not adequately provide electrical isolation between S/D contact structure 126 and other overlying elements of FET 102A. On the other hand, if the thickness is greater than 50 nm, the processing time (e.g., deposition time, polishing time, etc.) of S/D capping layer increases, and consequently increases device manufacturing cost.

Gate structure 112 can include a high-k gate dielectric layer 112A and a conductive layer 112B disposed on high-k gate dielectric layer 112A. Conductive layer 112B can be a multi-layered structure. The different layers of conductive layer 112B are not shown for simplicity. Conductive layer 112B can include a work function metal (WFM) layer disposed on high-k dielectric layer 112A, and a gate metal fill layer on the WFM layer. High-k gate dielectric layer can include a high-k dielectric material, such as $HfO_2$, $TiO_2$, hafnium zirconium oxide (HfZrO), $Ta_2O_3$, hafnium silicate ($HfSiO_4$), $ZrO_2$, and zirconium silicate ($ZrSiO_2$). The WFM layer can include titanium aluminum (TiAl), titanium aluminum carbide (TiAlC), tantalum aluminum (TaAl), tantalum aluminum carbide (TaAlC), and a combination thereof. The gate metal fill layer can include a suitable conductive material, such as W, Ti, silver (Ag), Ru, Mo, Cu, Co, Al, Ir, Ni, and a combination thereof.

Gate structure 112 can be electrically isolated from adjacent S/D contact structures 126 and/or via structure 130 by first inner spacers 113A, outer spacers 116, and air spacers 118, as shown in FIG. 1B. Further, gate structure 112 can be electrically isolated from adjacent epitaxial regions 110 by first and second inners spacers 113A-113B, as shown in FIG. 1C. In some embodiments, gate structure 112 can be further electrically isolated from overlying interconnect structures (e.g. metal line 142 as shown in FIG. 1H) by air cap 120 and air cap seal 124.

Each of inner spacers 113A-113B, outer spacers 116, and air spacers 118 extends along the width of gate structure 112 along a Y-axis. First inner spacers 113A can be disposed on and in physical contact with the sidewalls of gate structure 112 and outer spacers 116 can be disposed on first inner spacers 113A. In some embodiments, outer spacers 116 can be disposed on and in physical contact with the sidewalls of gate structure 112 when inner spacers 113A-113B are not included in FET 102A. Air spacers 118 can be interposed between outer spacers and etch stop layers (ESLs) 134, which are configured to protect gate structure 112 and/or epitaxial regions 110 during processing of FET 102A.

Air spacers 118 are cavities filled with air formed between outer spacers 116 and ESLs 134. In some embodiments, the cavities of air spacers 118 can be sealed by air spacer seals 122. Air spacer seals 122 can prevent materials from entering the cavities of air spacers 118 during the formation of layers overlying air spacers 118. Similarly, air cap 120 is a cavity filled with air formed between gate structure 112 and air cap seal 124. Air cap seal 124 can prevent materials from entering the cavity of air cap 120 during the formation of layers overlying air cap 120. In some embodiments, air spacer seals 122 can extend into air cap 120 and can be suspended over gate structure 112, as shown in FIGS. 1B-1C or can be disposed on gate structure 112, as shown in FIG. 1D. The different configurations of air spacer seals 122 within air cap 120 can be used to adjust the volume of air cap 120. In some embodiments, portions of air spacer seals 122 can be disposed on ESLs 134 and the top surfaces of these portions of air spacer seals 122 can be substantially coplanar with the top surfaces of S/D capping layer 128 and via structure 130, as shown in FIGS. 1B-1D. In some embodiments, these portions of air spacer seals 122 may be absent and the top surfaces of ESLs 134 is substantially coplanar with the top surfaces of S/D capping layer 128 and via structure 130, as shown in FIG. 1E.

In some embodiments, S/D capping layer 128, inner spacers 113A-113B, outer spacers 116, air spacer seals 122, air cap seal 124, and ESLs 134 can include an insulating material similar to or different from each other. In some embodiments, the insulating material can include SiN, ZrSi, SiCN, ZrAlO, $TiO_2$, $Ta_2O_5$, $ZrO_2$, $La_2O_3$, ZrN, SiC, ZnO, SiOC, $HfO_2$, $Al_2O_3$, SiOCN, Si, $HfSi_2$, AlON, $Y_2O_3$, TaCN, $SiO_2$, or a combination thereof. In some embodiments, each of first inner spacers 113A, outer spacers 116, and ESLs 134 can have a thickness along an X-axis substantially equal to or different from each other. In some embodiments, each of air spacers 118 can have a thickness along an X-axis equal to or greater than the thickness of each of first inner spacers 113A, outer spacers 116, and/or ESLs 134 along the X-axis. In some embodiments, each of air spacers 118 can have a thickness along an X-axis twice the thickness of each of outer spacers 116 along the X-axis. The thickness of each of first inner spacers 113A, outer spacers 116, air spacers 118, and ESLs 134 can range from about 1 nm to about 10 nm. In some embodiments, air spacers 118 can have a height along a Z-axis equal to or greater than a height of gate structure 112 along the Z-axis and the height of air spaces 118 can range from about 1 nm to about 50 nm.

In some embodiments, the thickness of air spacer seals 122 disposed above air spacers 118 is substantially equal to the thickness of air spacers 118 along an X-axis. In some embodiments, the thickness of air spacer seals 122 disposed above ESLs 134 and within air cap 120 can be substantially equal to or greater than the thickness of ESLs 134 along an X-axis and can range from about 1 nm to about 15 nm. In some embodiments, air cap 120 can have a thickness T1 substantially equal to or smaller than thickness T2 of air cap seal 124. Thickness T1 can range from about 1 nm to about 15 nm and thickness T2 can range from about 1 nm to about 25 nm.

The above discussed dimension ranges of first inner spacers 113A, outer spacers 116, air spacers 118, air cap 120, air spacer seals 122, air cap seal 124, and/or ESLs 134 provide adequate electrical isolation between gate structure and adjacent epitaxial regions 110, S/D contact structure 126, via structure 130, and/or interconnect structures (e.g. metal line 142 as shown in FIG. 1H). Below the dimension ranges, first inner spacers 113A, outer spacers 116, air spacers 118, air cap 120, air spacer seals 122, air cap seal 124, and/or ESLs 134 may not adequately provide the electrical isolation to gate structure 112. On the other hand, if the dimensions are higher than the above discussed ranges, the processing time (e.g., deposition time, etching time, etc.) for forming first inner spacers 113A, outer spacers 116, air spacers 118, air cap 120, air spacer seals 122, air cap seal 124, and/or ESLs 134 increases, and consequently increases device manufacturing cost.

Figure 1F:
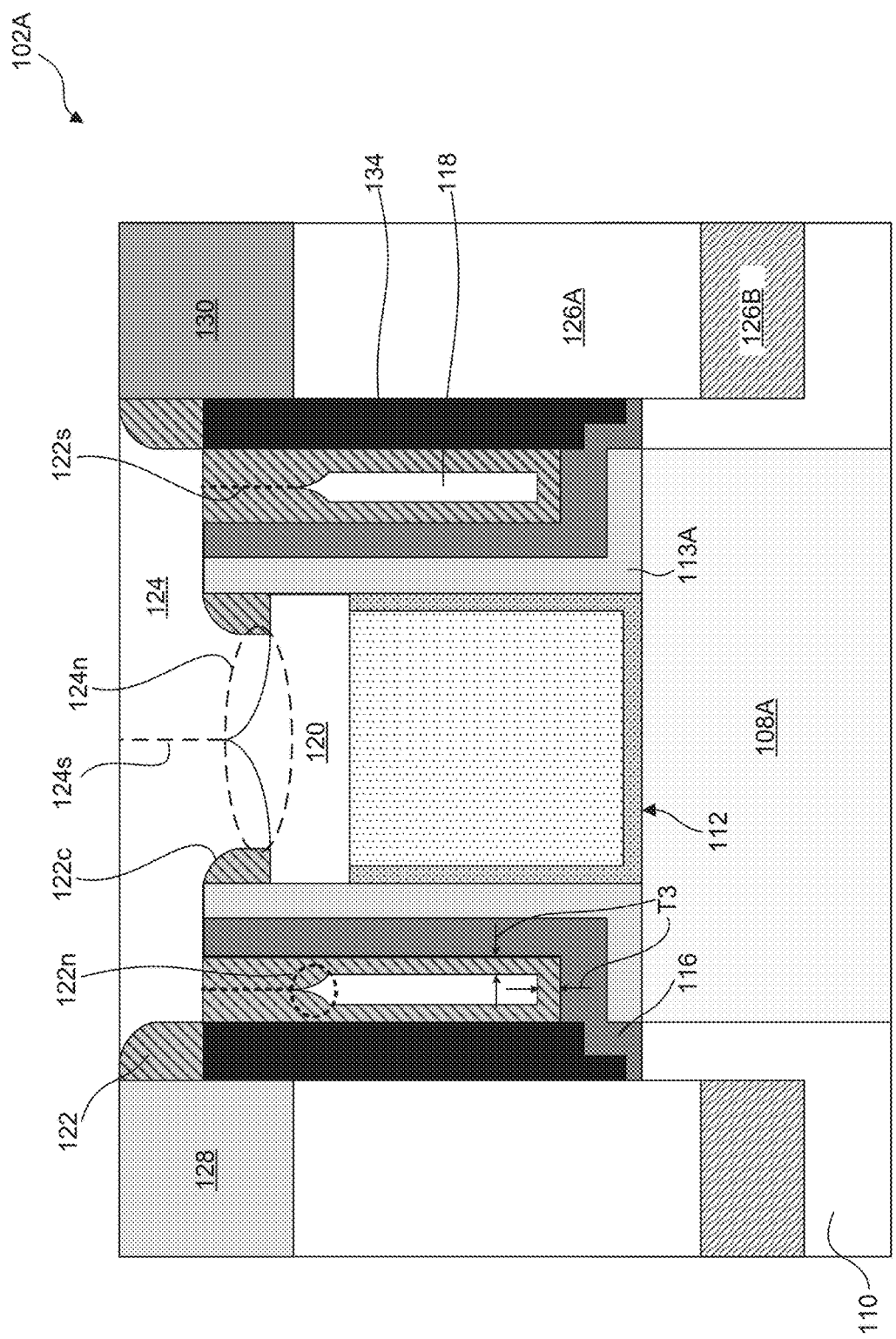

In some embodiments, air spacers 118, air cap 120, air spacer seals 122, and air cap seal 124 can have the structures shown in FIG. 1F instead of the structures shown in FIG. 1B. FIG. 1F illustrates the region of FET 102A within area 103A of FIG. 1B for different configurations of air spacers 118, air cap 120, air spacer seals 122, and air cap seal 124. Air spacer seals 122 on ESLs 134 and air cap 120 can have rounded corners 122c with a radius of curvature of about 0.5 nm to about 5 nm, which can be a result of the etching rate used during the formation of air spacer seals 122, which is described in further detail below. Air spacer seals 122 surrounding air spacers 118 can have thicknesses T3 of about 0.5 nm to about 10 nm and seams 122s with lengths of about 0.5 nm to about 5 nm, which can be a result of the deposition rate used during the formation of air spacer seals 122, which is described in further detail below. The deposition rate used for forming air spacer seals 122 can also form "necks" 122n with lengths of about 0.5 nm to about 5 nm along a Z-axis prior to forming seams 122s. Similarly, the deposition rates used for forming air cap seal 124 can form "necks" 124n with lengths of about 0.5 nm to about 5 nm along a Z-axis prior to forming seams 124s, as shown in FIG. 1F.

Figure 1G:
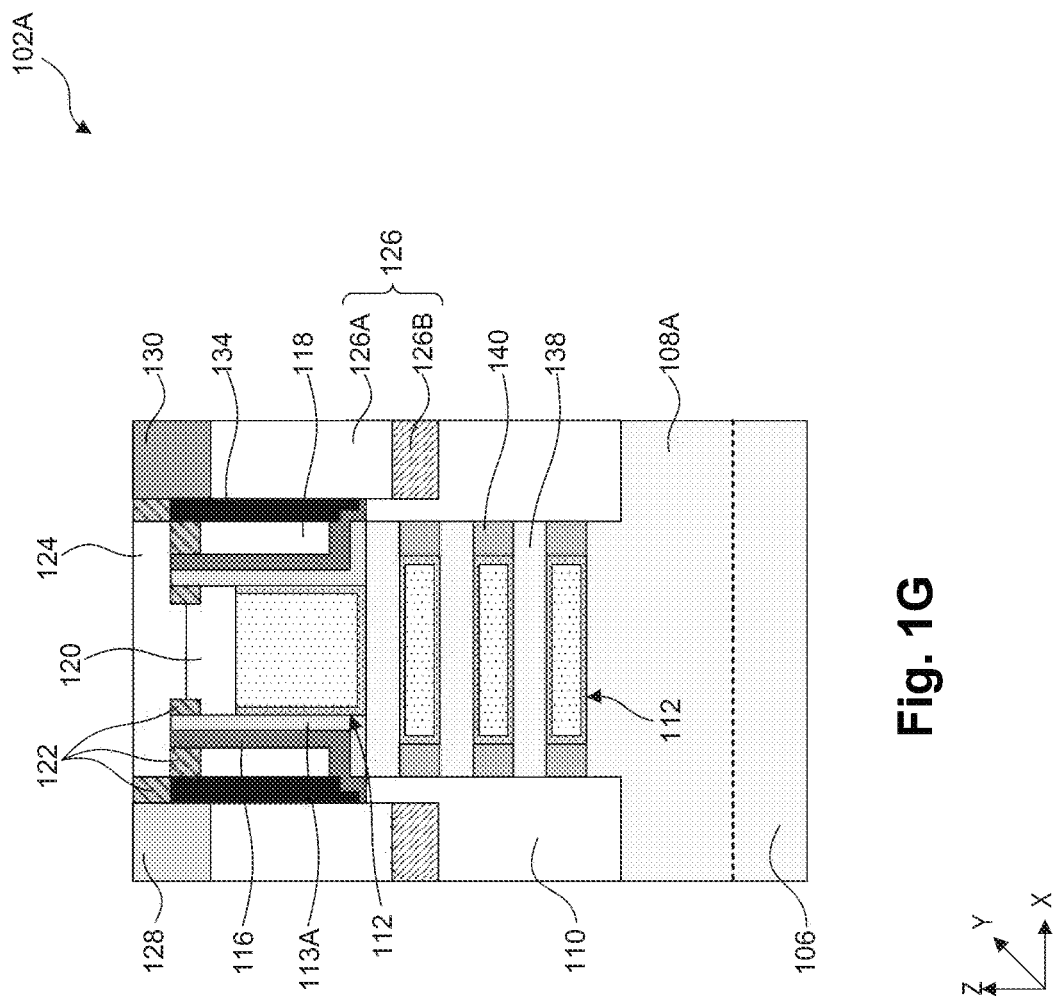
Figure 1I:
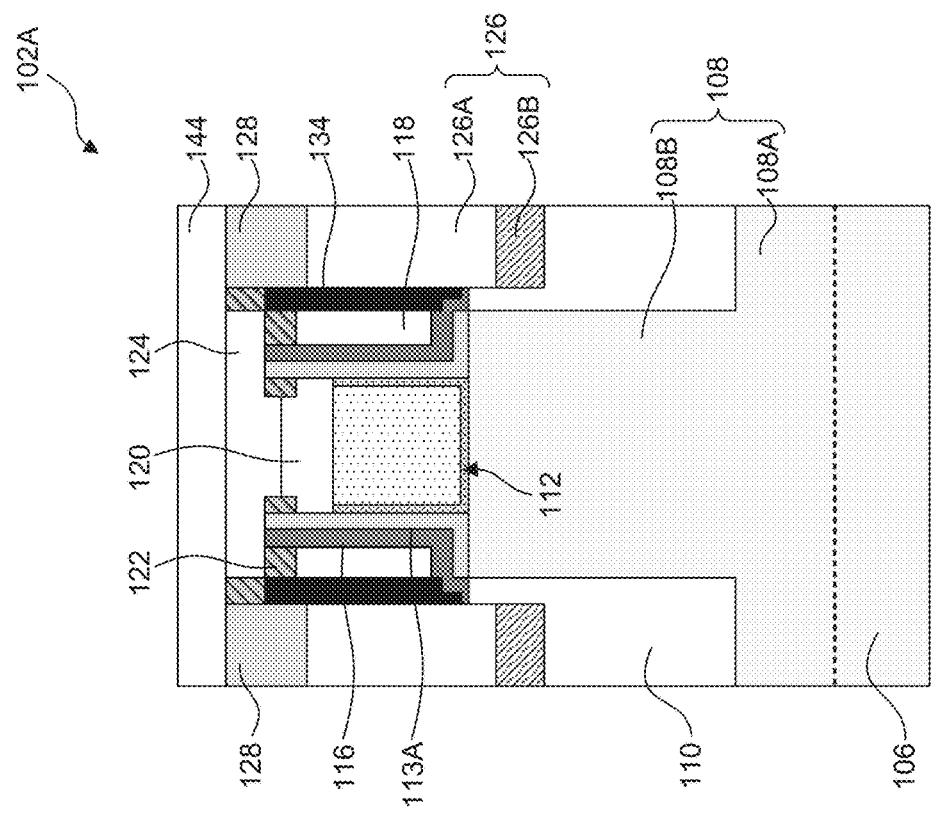
Figure 1H:
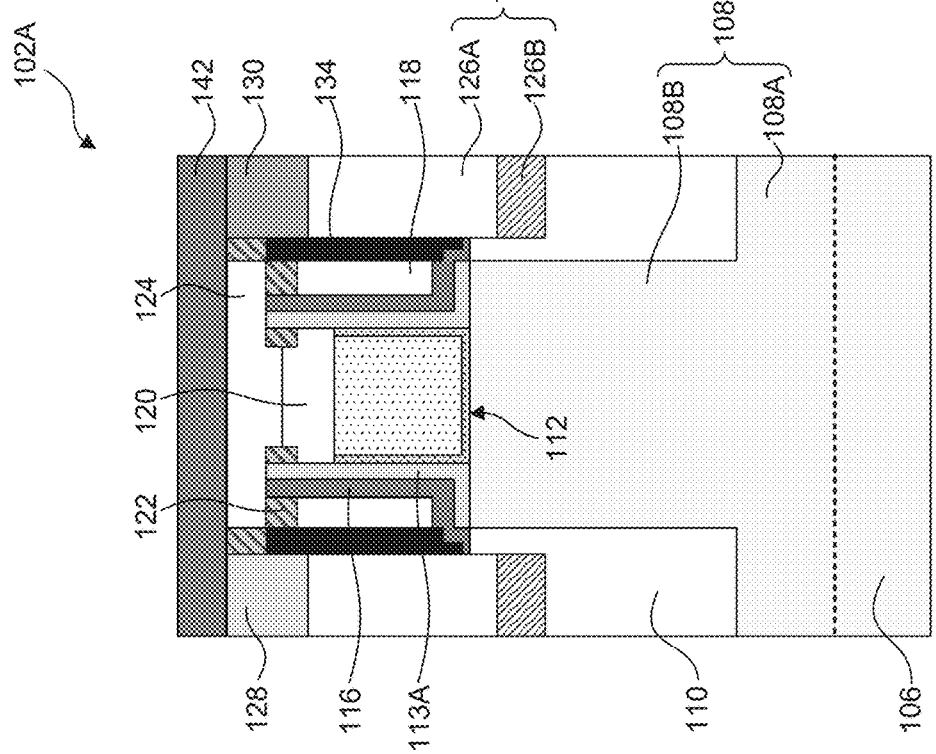

In some embodiments, FET 102A can have nanostructured channel regions 138 with gate structure 112 surrounding each of nanostructured channel regions 138, as shown in FIG. 1G, instead of raised fin region 108B and gate structure 112 of FIGS. 1B-1F and 1H-1I. Such gate structure 112 can be referred to as "gate-all-around (GAA) structure 112" and FET 102A with GAA structure 112 can be referred to as "GAA FET 102A." Nanostructured channel regions 138 can include (i) an elementary semiconductor, such as Si or Ge; (ii) a compound semiconductor including a III-V semiconductor material; (iii) an alloy semiconductor including SiGe, germanium stannum, or silicon germanium stannum; or (iv) a combination thereof. The portions of gate structure 112 surrounding nanostructured channel regions 138 can be electrically isolated from adjacent epitaxial regions 110 by spacers 140. Spacers 140 can include a material similar to outer spacers 116.

In some embodiments, the structure of FIG. 1B can have a metal line 142 of an interconnect structure, as shown in FIG. 1H when via structure 130 is present or can have a dielectric layer 144 of the interconnect structure, as shown in FIG. 1I when via structure 130 is not disposed on S/D contact structure 126.

Semiconductor device 100 can further include interlayer dielectric (ILD) layer 132 and shallow trench isolation (STI) regions 136. ILD layer 132 can be disposed on ESLs 134 and can include a dielectric material. STI regions 136 can include an insulating material.

Figure 2:
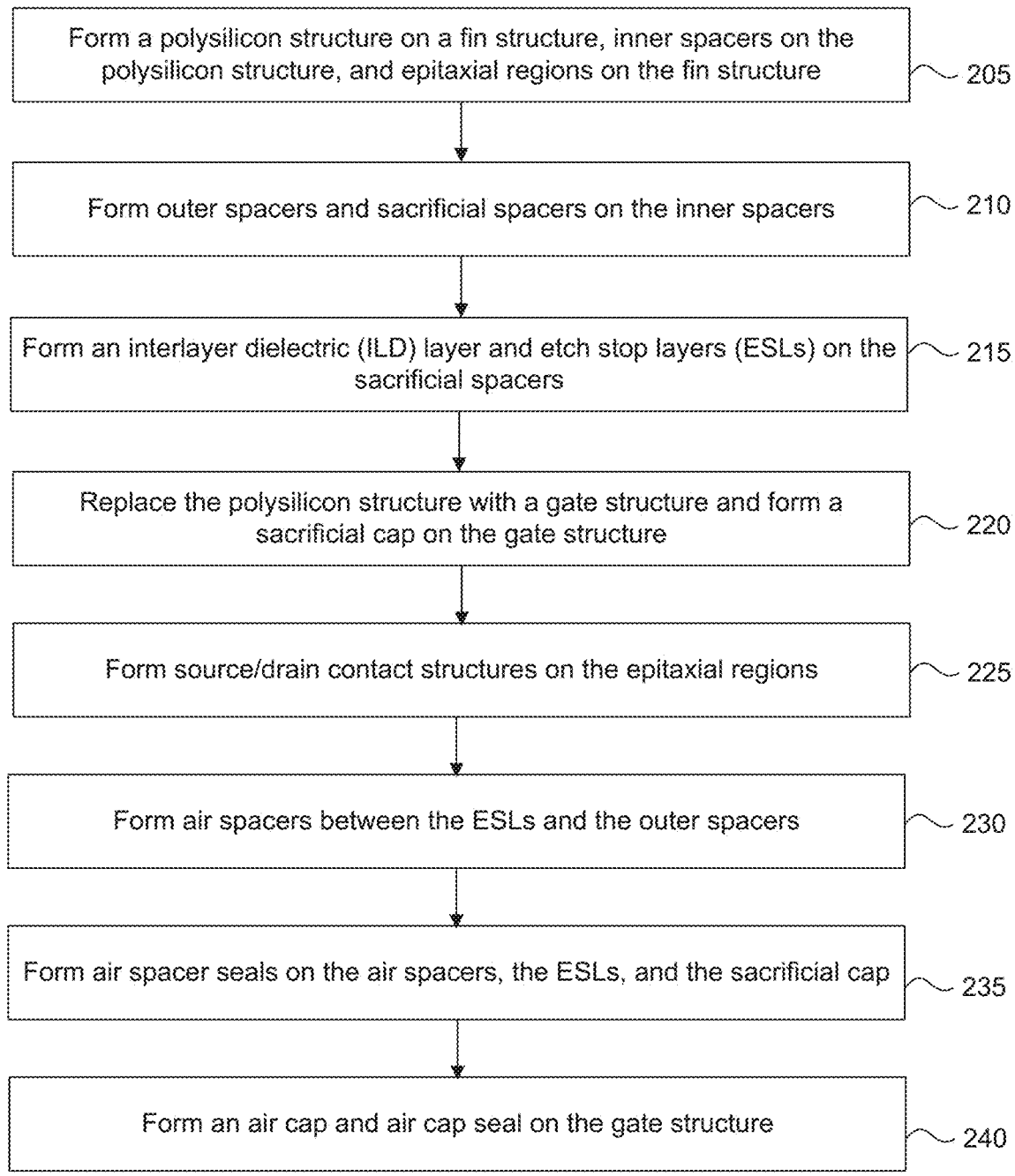
FIG. 2 is a flow diagram of a method for fabricating a semiconductor device with air spacer and capping structures, in accordance with some embodiments.

FIG. 2 is a flow diagram of an example method 200 for fabricating FET 102A of semiconductor device 100, according to some embodiments. For illustrative purposes, the operations illustrated in FIG. 2 will be described with reference to the example fabrication process for fabricating FET 102A as illustrated in FIGS. 3A-18C. FIGS. 3A-18A are top views of FET 102A at various stages of fabrication, according to some embodiments. FIGS. 3B-18B and 3C-18C are views of regions 103A-103B of FIGS. 1B-1C at various stages of fabrication, according to some embodiments. Operations can be performed in a different order or not performed depending on specific applications. It should be noted that method 200 may not produce a complete FET 102A. Accordingly, it is understood that additional processes can be provided before, during, and after method 200, and that some other processes may only be briefly described herein. Elements in FIGS. 3A-18C with the same annotations as elements in FIGS. 1A-1I are described above.

In operation 205, a polysilicon structure and epitaxial regions are formed on a fin structure and inner spacers are formed on the polysilicon structure. For example, as shown in FIGS. 3A-3C, a polysilicon structure 312 and a hard mask layer 346 can be formed on fin structure 108. During subsequent processing, polysilicon structure 312 can be replaced in a gate replacement process to form gate structure 112. Following the formation of spacers 114 along the sidewalls of polysilicon structure 312, epitaxial regions 110 can be selectively formed on fin recessed regions 108A, as shown in FIG. 1B.

Figure 4A:
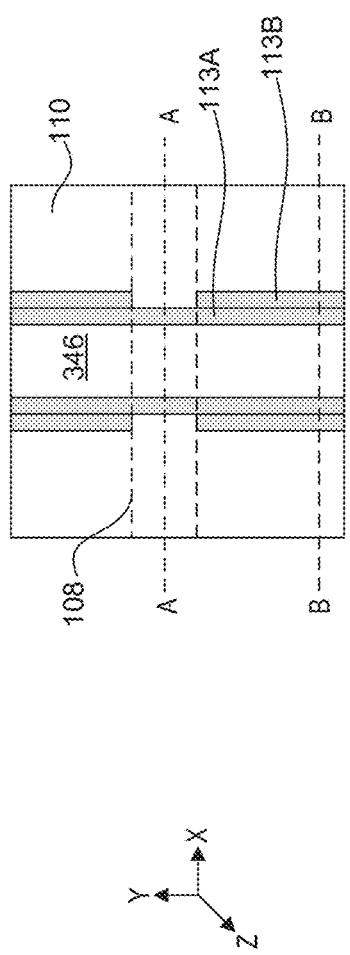
Figure 4C:
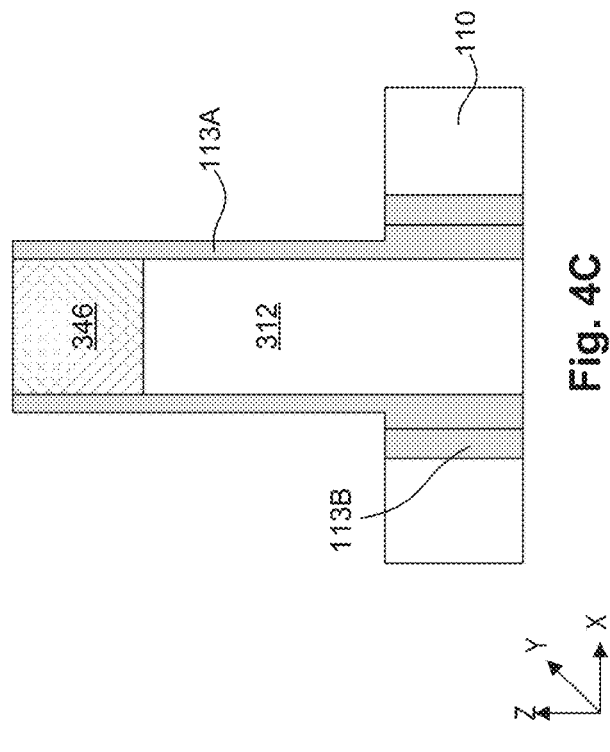
Figure 4B:
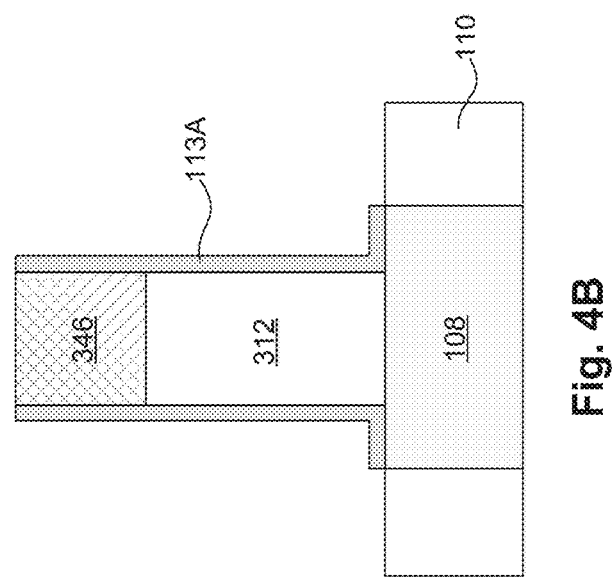
Figure 5A:
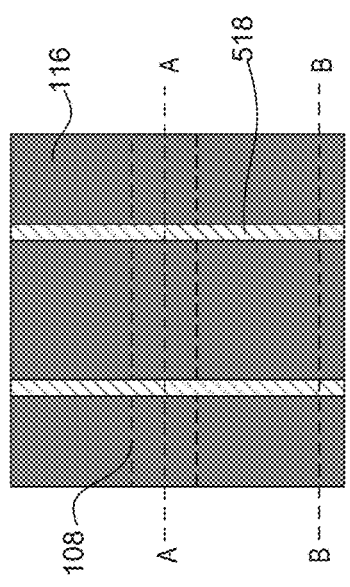
Figure 5C:
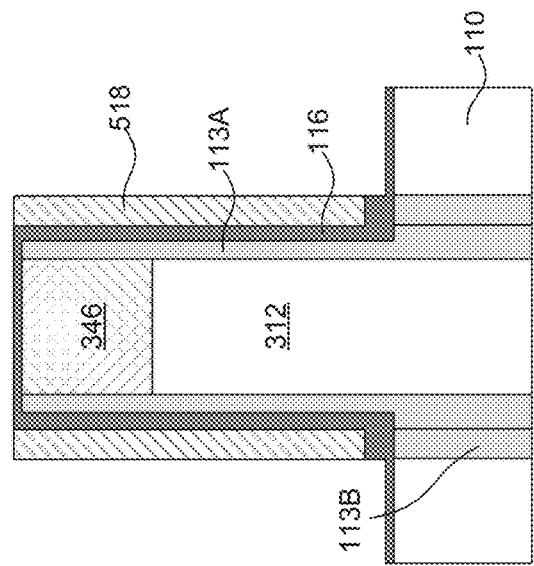
Figure 5B:
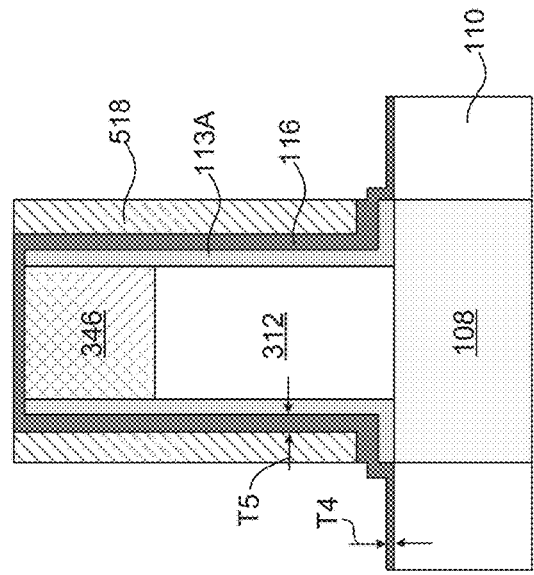

Referring to FIG. 2, in operation 210, outer spacers and sacrificial spacers are formed on the inner spacers. For example, as shown in FIGS. 5A-5C, outer spacers 116 and sacrificial spacers 518 can be formed on inner spacers 114. The formation of outer spacers and sacrificial spacers can include sequential operations of (i) selectively etching portions of second inner spacers 113B that are above fin structure 108, as shown in FIGS. 4A-4C, (ii) selectively thinning down portions of first inner spacers 113A that are above fin structure 108, as shown in FIGS. 4A-4C, (iii) depositing and patterning outer spacers 116 on the structures of FIGS. 4A-4C, and (iv) depositing and patterning sacrificial spacers 518 on outer spacers 116 to form the structures of FIGS. 5A-5C. During subsequent processing, sacrificial spacers 518 are removed to form air spacers 118. The patterning of outer spacers 116 and sacrificial spacers 518 can include a dry etching process with etchants, such as chlorine-based gas, oxygen, hydrogen, bromine-based gas, and a combination thereof. Sacrificial spacers 518 can include an insulating material different from the insulating material of first inner spacers 113A, outer spacers 116, S/D capping layers 128, ILD layer 132, and ESLs 134. In some embodiments, portions of outer spacers on epitaxial regions 110 can have a thickness T4 smaller than thickness T5 of portions of outer spacers on first inner spacers 113A. Thickness T4-T5 can range from about 0.5 nm to about 10 nm.

Figure 6A:
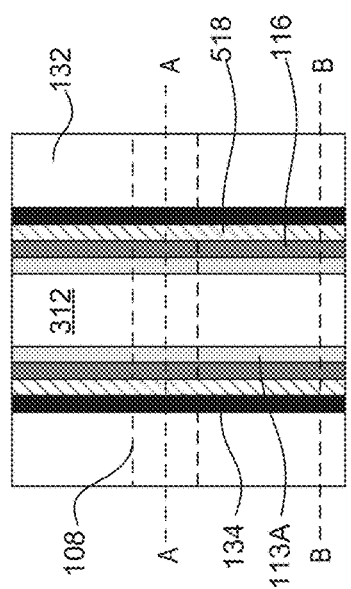
Figure 6C:
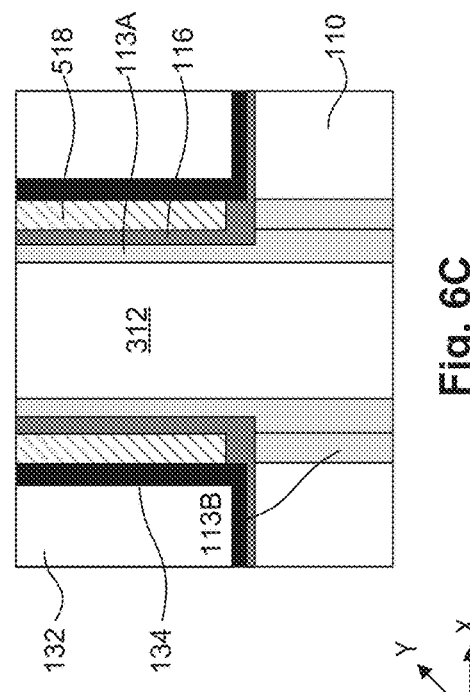
Figure 6B:
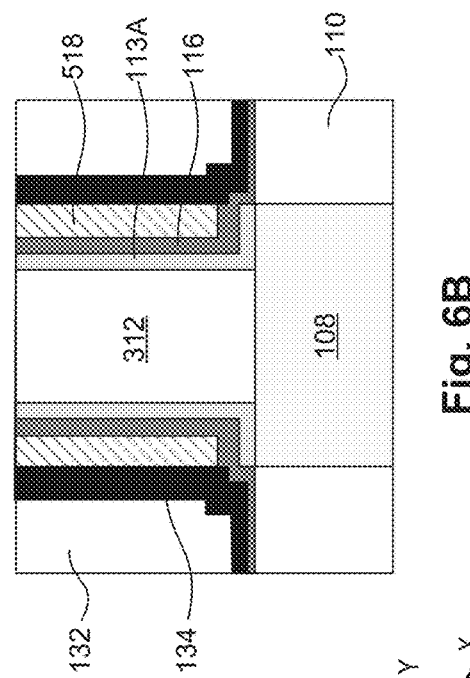

Referring to FIG. 2, in operation 215, an ILD layer and ESLs are formed on the sacrificial spacers. For example, as shown in FIGS. 6A-6C, ILD layer 132 and ESLs 134 can be formed on outer spacers 116. The formation of ILD layer 132 and ESLs 134 can include sequential operations of (i) depositing ESLs 134 on the structures of FIGS. 5A-5C using a chemical vapor deposition (CVD) process, (ii) depositing ILD layer 132 on ESLs 134 using a CVD process or a suitable dielectric material deposition process, and (iii) performing a chemical mechanical polishing (CMP) process to remove hard mask layer 346 and substantially coplanarize the top surfaces of polysilicon structure 312, first inner spacers 113A, outer spacers 116, sacrificial spacers 518, ESLs 134, and ILD layer 132 with each other, as shown in FIGS. 6A-6C.

Figure 7A:
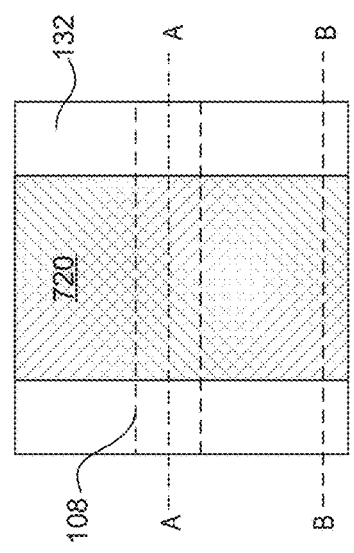
Figure 7B:
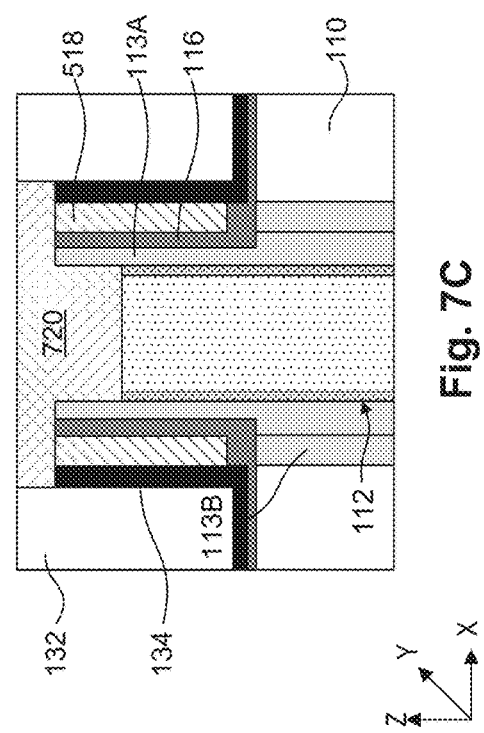
Figure 7C:
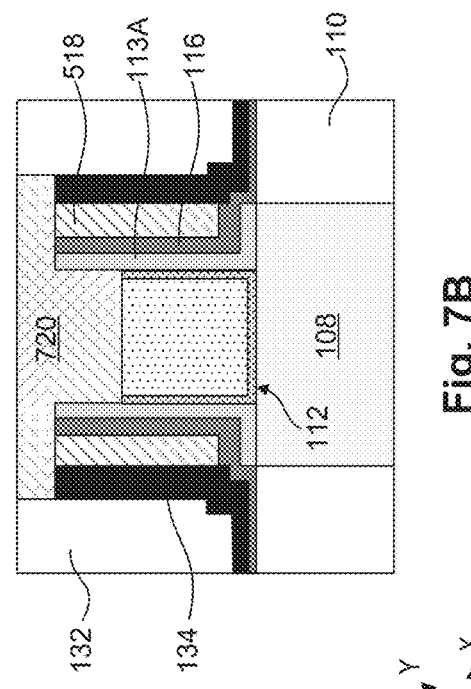

Referring to FIG. 2, in operation 220, the polysilicon structure is replaced with a gate structure and a sacrificial cap is formed on the gate structure. For example, as shown in FIGS. 7A-7C, polysilicon structure 312 can be replaced with gate structure 112 and a sacrificial cap 720 can be formed on gate structure 112. The formation of gate structure 112 can include sequential operations of (i) etching polysilicon structure 312 to form a cavity (not shown), (ii) depositing high-k gate dielectric layer 112A within the cavity using a CVD process, an atomic layer deposition (ALD) process, or a suitable high-k dielectric material deposition process, (iii) depositing conductive layer 112B on high-k gate dielectric layer 112A using a CVD process, an atomic layer deposition (ALD) process, or a suitable conductive material deposition process, (iv) performing a CMP process to substantially coplanarize the top surface of gate structure 112 with the top surfaces of polysilicon structure 312, first inner spacers 113A, outer spacers 116, sacrificial spacers 518, ESLs 134, and ILD layer 132, and (v) etching back gate structure 112, as shown in FIGS. 7B-7C. The etching back can include a dry etching process with etchants that have a higher etch selectivity for the materials of gate structure 112 than the materials of first inner spacers 113A, outer spacers 116, sacrificial spacers 518, and ESLs 134. The etchants can include chlorine-based gas, methane ($CH_4$), boron chloride ($BCL_3$), oxygen, or a combination thereof.

The formation of sacrificial cap 720 can include sequential operations of (i) etching back first inner spacers 113A, outer spacers 116, sacrificial spacers 518, and ESLs 134, as shown in FIGS. 7B-7C, (ii) depositing the material of sacrificial cap 720 on ILD layer 132 and the etched back gate structure 112, first inner spacers 113A, outer spacers 116, sacrificial spacers 518, and ESLs 134 using a CVD process or a suitable insulating material deposition process, and (iii) performing a CMP process to substantially coplanarize the top surface of sacrificial cap 720 with the top surface of ILD layer 132 to form the structures of FIGS. 7B-7C. The etching back can include a dry etching process with etchants that have a higher etch selectivity for the materials of first inner spacers 113A, outer spacers 116, sacrificial spacers 518, and ESLs 134 than the materials of gate structure 112. The etchants can include a hydrogen fluoride (HF) based gas, a carbon fluoride ($C_xF_y$) based gas, or a combination thereof.

Figure 8A:
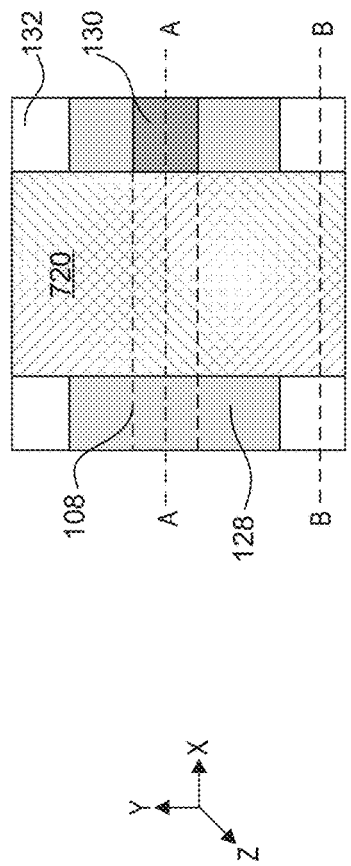
Figure 8C:
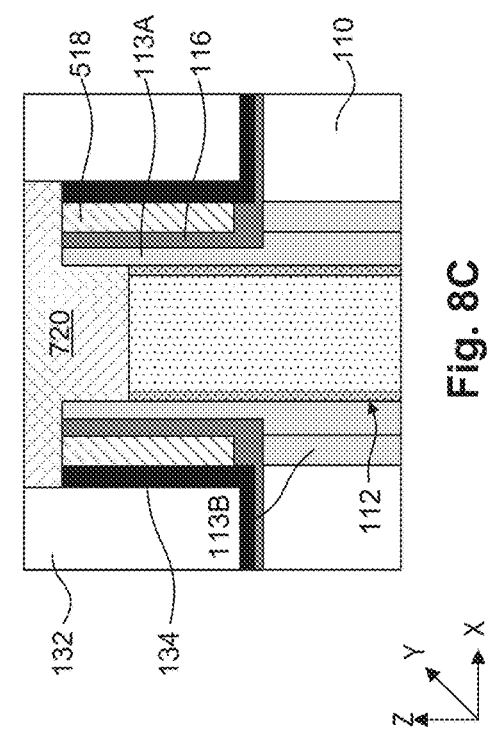
Figure 8B:
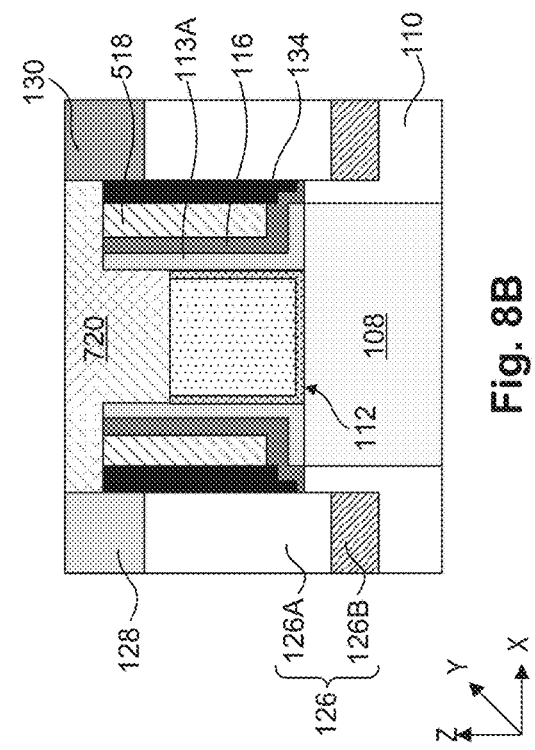
Figure 9A:
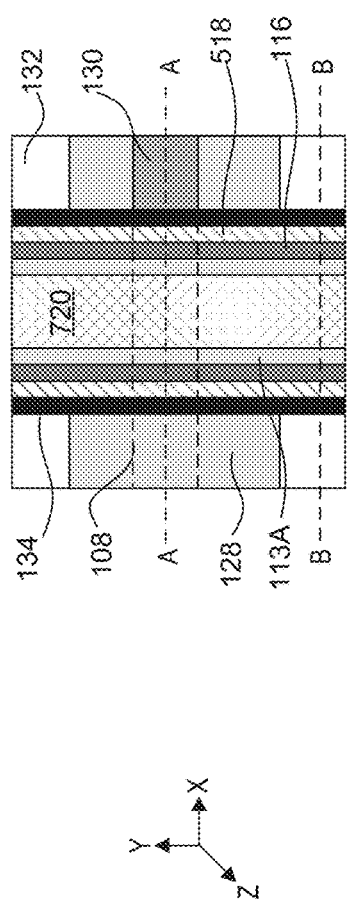
Figure 9C:
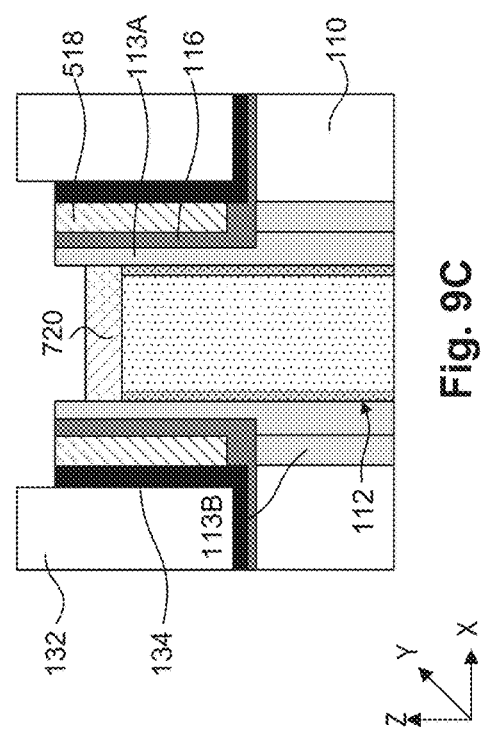
Figure 9B:
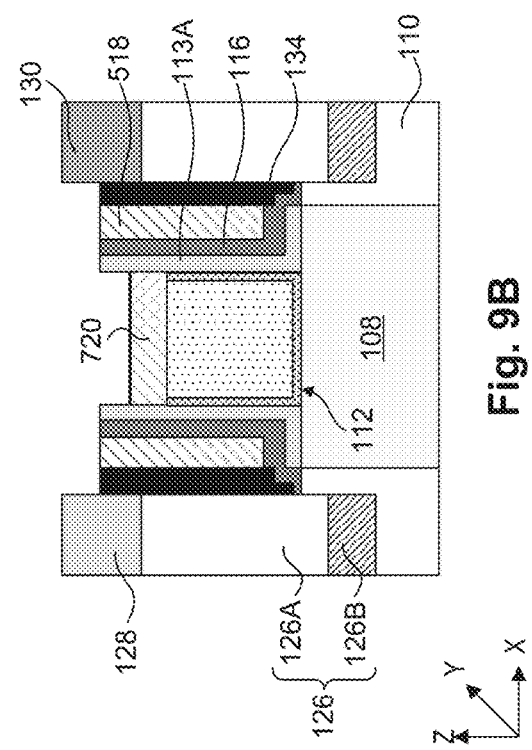

Referring to FIG. 2, in operation 225, S/D contact structures are formed on the epitaxial regions. For example, as shown in FIGS. 8A-8C, S/D contact structures 126 can be formed on epitaxial regions 110. The formation of S/D contact structures 126 can include sequential operations of (i) etching portions of ILD layer 132, ESLs 134_, outer spacers 116 and epitaxial regions 110 to form contact openings (not shown), (ii) forming silicide layers 126B within the contact openings, as shown in FIGS. 8B-8C, (iii) filling the contact openings with the material(s) of S/D contact plugs 126A using a CVD process or a suitable conductive material deposition process, (iv) performing a CMP process to substantially coplanarize the top surface of S/D contact plugs 126A with the top surface of sacrificial cap 720 (not shown in FIGS. 8A-8C; shown in FIGS. 17A-17C), and (v) etching back S/D contact plugs 126A to form S/D contact structures 126 shown in FIGS. 8B-8C. The etching back can include a dry etching process with etchants, such as chlorine-based gas, methane ($CH_4$), boron chloride ($BCL_3$), oxygen, and a combination thereof.

Figure 17A:
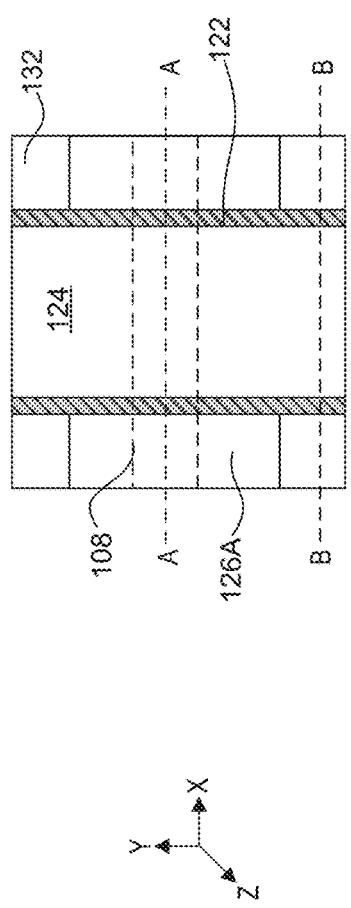
Figure 17C:
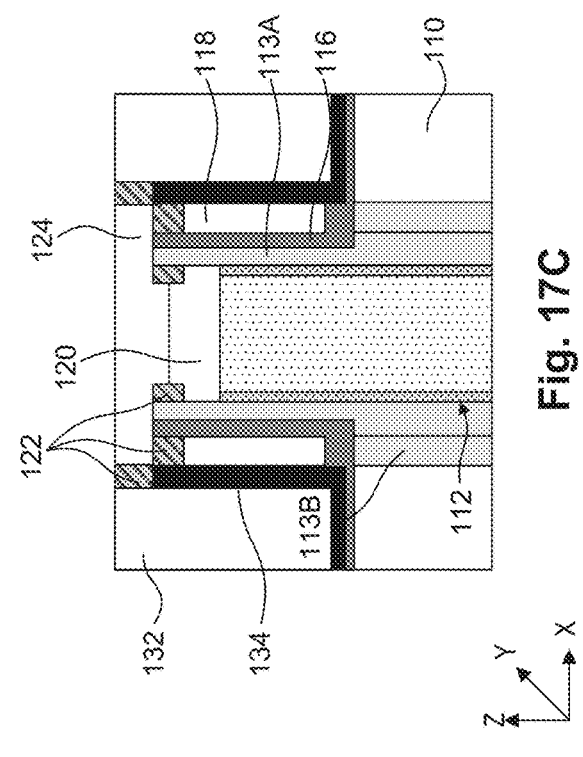
Figure 17B:
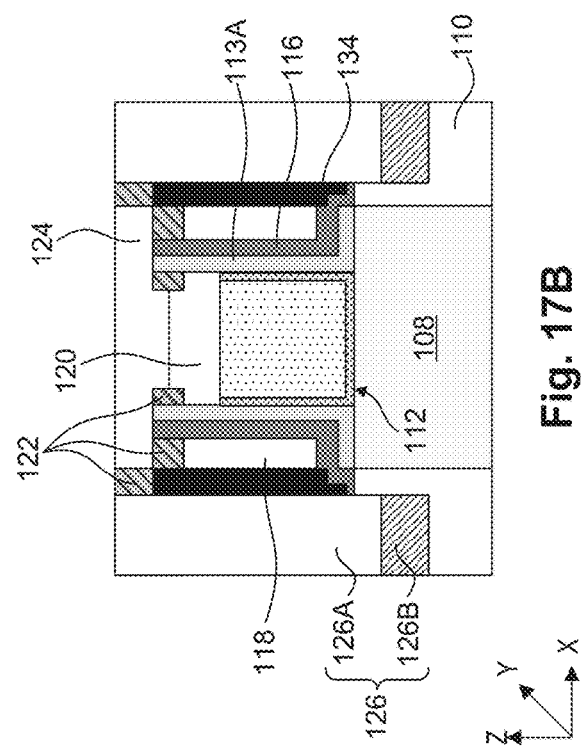

S/D contact structures 126 of FIGS. 17A-17C are formed if S/D capping layers 128 and/or via structure 130 are not subsequently formed. On the other hand, S/D contact structures of FIGS. 8A-8C are formed if S/D capping layers 128 and via structure 130 are subsequently formed. The formation of S/D capping layers 128 and via structure 130 can include sequential operations of (i) depositing the material of S/D capping layers 128 on the etched back S/D contact plugs 126A using a CVD process or a suitable insulating material deposition process, (ii) performing a CMP process to substantially coplanarize the top surface of S/D capping layers 128 with the top surface of sacrificial cap 720, (iii) etching a portion of S/D capping layers 128 to form a via opening (not shown), (iv) depositing the material of via structure 130 within the via opening using a CVD process, an atomic layer deposition (ALD) process, or a suitable conductive material deposition process, and (v) performing a CMP process to substantially coplanarize the top surface of via structure 130 with the top surface of sacrificial cap 720, as shown in FIGS. 8A-8C.

Referring to FIG. 2, in operation 230, air spacers are formed between the outer spacers and the ESLs. For example, as shown in FIGS. 10A-10C, air spacers 118 can be formed between outer spacers 116 and the ESLs 134. The formation of air spacers can include sequential operations of (i) etching back sacrificial cap 720, as shown FIGS. 9A-9C and (ii) removing sacrificial spacers 518, as shown in FIGS. 10A-10C. In some embodiments, the etching back of sacrificial cap 720 and the removal of sacrificial spacers 518 can include using a chemical etching process with similar etchants, such as chlorine-based gas, hydrogen, oxygen, fluorine-based gas, and a combination thereof, but with different concentrations of the etchants and at different etching temperatures. The etch selectivity of the etchants for the materials of sacrificial cap 720 and sacrificial spacers 518 are dependent on the etchant concentration and etching temperature. The etchants used for selectively etching sacrificial cap 720 have a lower hydrogen concentration than the etchants used for selectively removing sacrificial spacers 518. In addition, the temperature (e.g., between about 30° C. and about 150° C.) used for selectively etching sacrificial cap 720 is lower than the temperature used for selectively removing sacrificial spacers 518. In some embodiments, the removal of sacrificial spacers 518 can include using a chemical etching process with etchants, such as helium, hydrogen, oxygen, fluorine-based gas, and a combination thereof.

Figure 11A:
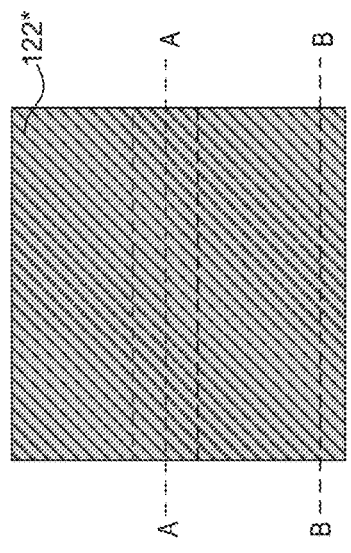
Figure 11C:
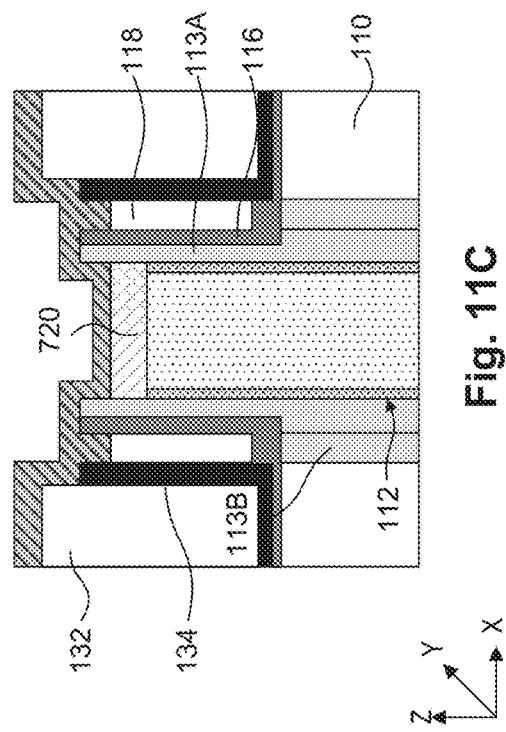
Figure 11B:
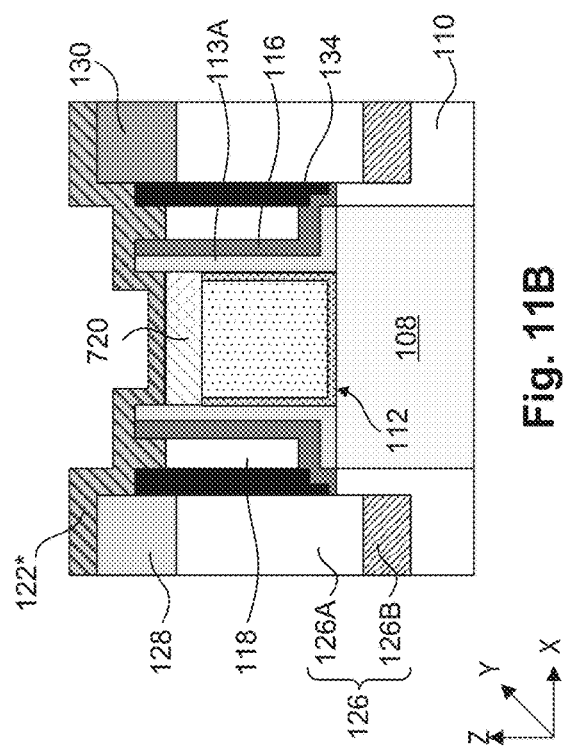
Figure 12A:
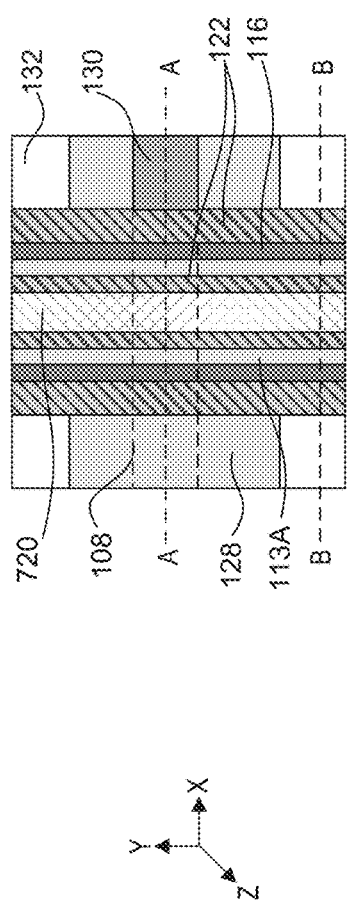
Figure 12C:
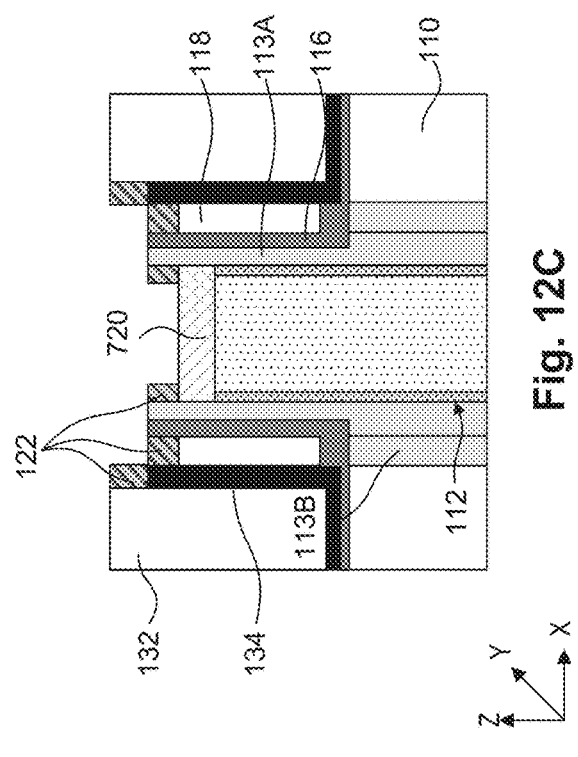
Figure 12B:
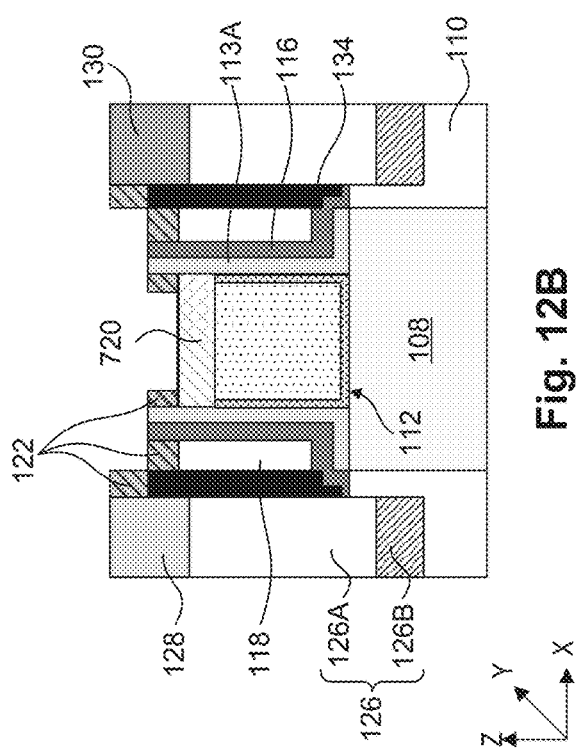

Referring to FIG. 2, in operation 235, air spacer seals are formed on the air spacers, the sacrificial cap, and the ESLs. For example, as shown in FIGS. 12A-12C, air spacer seals 122 can be formed on air spacers 118, sacrificial cap 720, and ESLs 134. The formation of air spacer seals 122 can include sequential operations of (i) depositing the material of air spacer seals 122 on the structures of FIGS. 10A-10C to form a sealing layer 122*, as shown in FIGS. 11A-11C and (ii) etching sealing layer 122* to form the structures of FIGS. 12A-12C. In some embodiments, the deposition of sealing layer 122* is performed at a deposition rate of about 1 nm/min to about 5 nm/min and at a deposition temperature of about 100° C. to about 400° C. to prevent any conformal deposition of the material of air spacer seals 122 within air spacers 118. If the material of air spacer seals 122 is deposited at a deposition rate slower than about 1 nm/min and at a deposition temperature lower than about 100° C., air spacer seals 122 may be formed within air spacers 118 as discussed above with reference to FIG. 1F. In some embodiments, the etching of sealing layer 122* can include an anisotropic dry etching process at a temperature of about 50° C. to about 100° C. with etchants, such as chlorine-based gas, fluorine-based gas, oxygen, and a combination thereof.

Referring to FIG. 2, in operation 240, an air cap and an air cap seal are formed on the gate structure. For example, as shown in FIGS. 14A-14C, air cap 120 and air cap seal 124 can be formed on gate structure 112. The formation of air cap 120 can include removing sacrificial cap 720 to form the structures of FIGS. 13A-13C. In some embodiments, the removal of sacrificial cap 720 can include using an isotropic chemical etching process with etchants, such as chlorine-based gas, hydrogen, oxygen, fluorine-based gas, and a combination thereof at an etching temperature of about 30° C. to about 150° C.

Figure 13A:
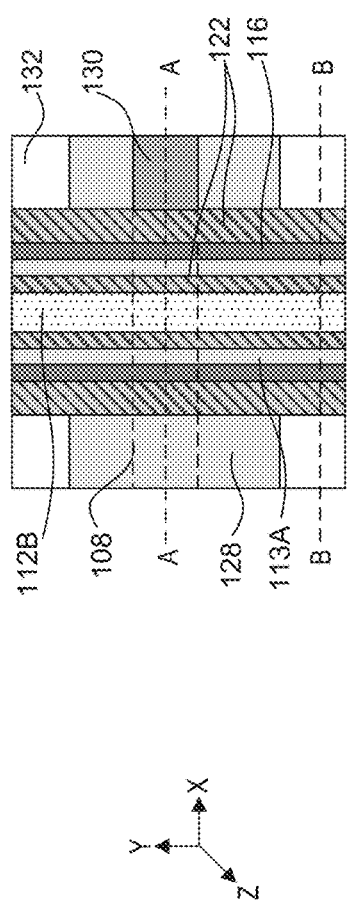
Figure 13C:
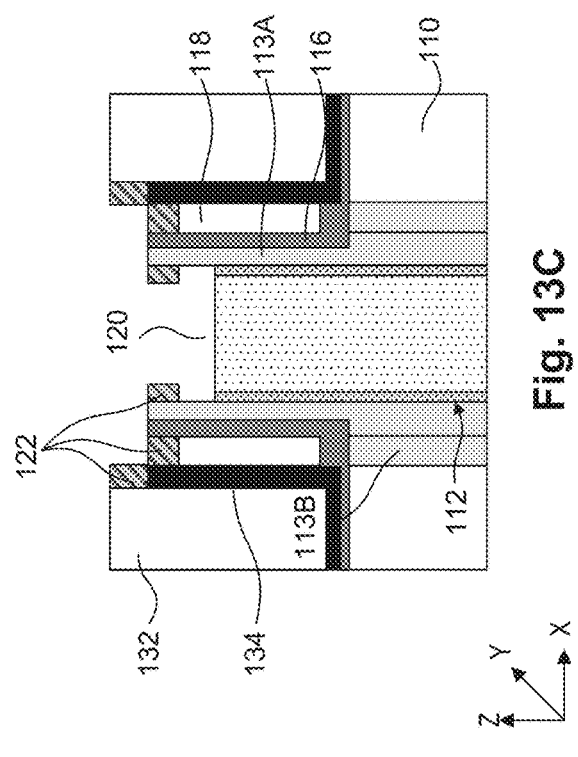
Figure 13B:
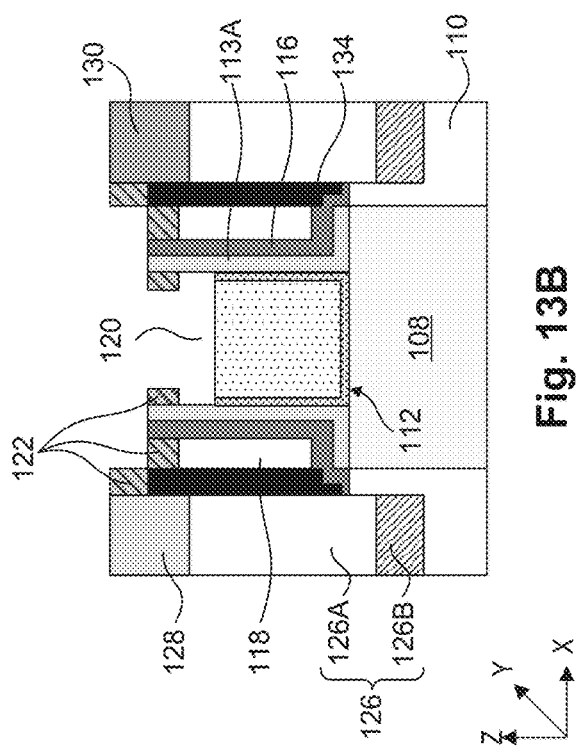

The formation of air cap seal 124 can include sequential operations of (i) depositing the material of air cap seal 124 on the structures of FIGS. 13A-13C and (ii) performing a CMP process to substantially coplanarize the top surface of air cap seal 124 with the top surface of ILD layer 132, as shown in FIGS. 14A-14C. Similar to the deposition of the material of air spacer seals 122, the material of air cap seal 124 can be deposited at a deposition rate of about 1 nm/min to about 5 nm/min and at a deposition temperature of about 100° C. to about 400° C. to prevent any conformal deposition of the material within air cap 120.

Figure 15A:
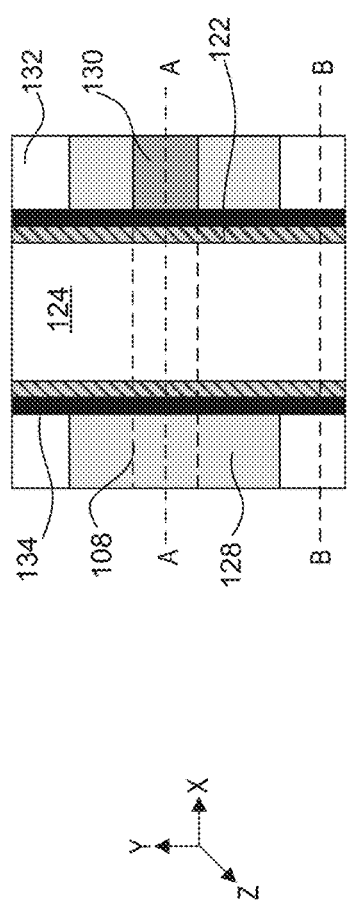
Figure 15C:
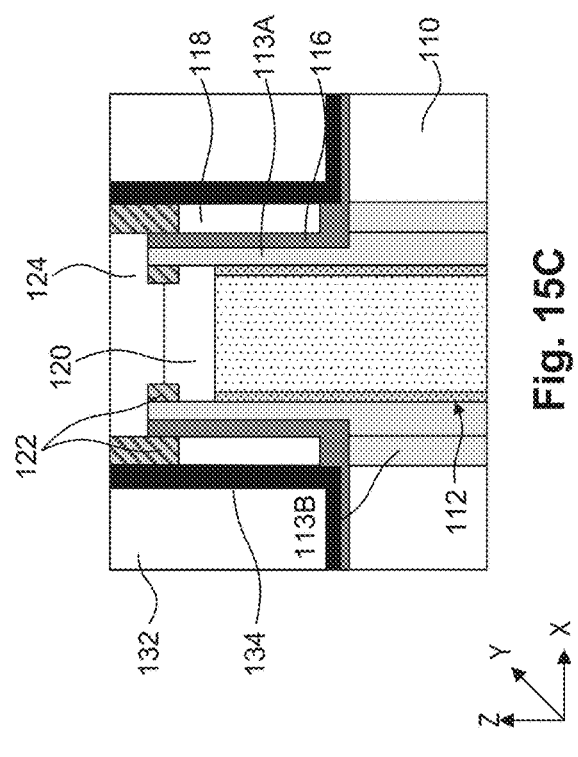
Figure 15B:
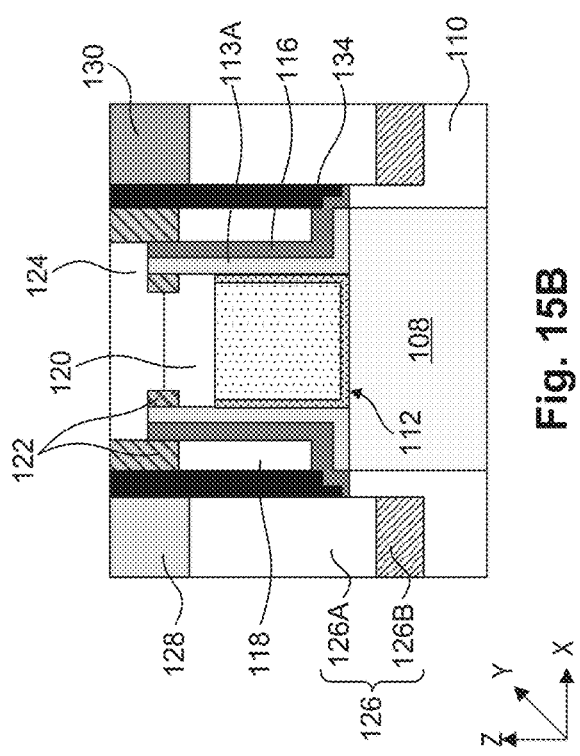

In some embodiments, the structures of FIGS. 15A-15C with the top surfaces of ESLs 134 substantially coplanar with the top surfaces of ILD layer 132 can be formed if ESLs 134 are not etched back during the formation of sacrificial cap 720 in operation 220.

In some embodiments, the structures of FIGS. 16A-16C with cylindrical via structure 130 can be formed if cylindrical via openings are formed within S/D capping layer 128 during the formation of via structure 130 in operation 225.

In some embodiments, the structures of FIGS. 17A-17C with the top surfaces of S/D contact plugs 126A substantially coplanar with the top surfaces of ILD layer 132 and air cap seal 124 can be formed if S/D capping layer 128 and via structure 130 are not formed in operation 225.

Figure 18A:
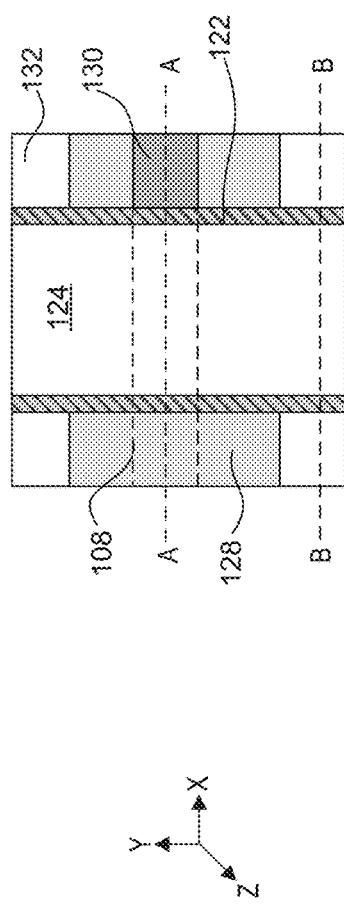
Figure 18C:
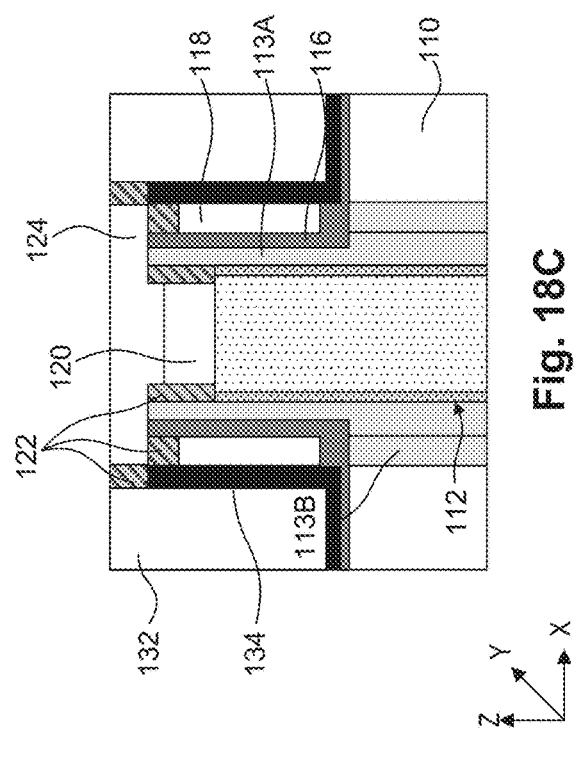
Figure 18B:
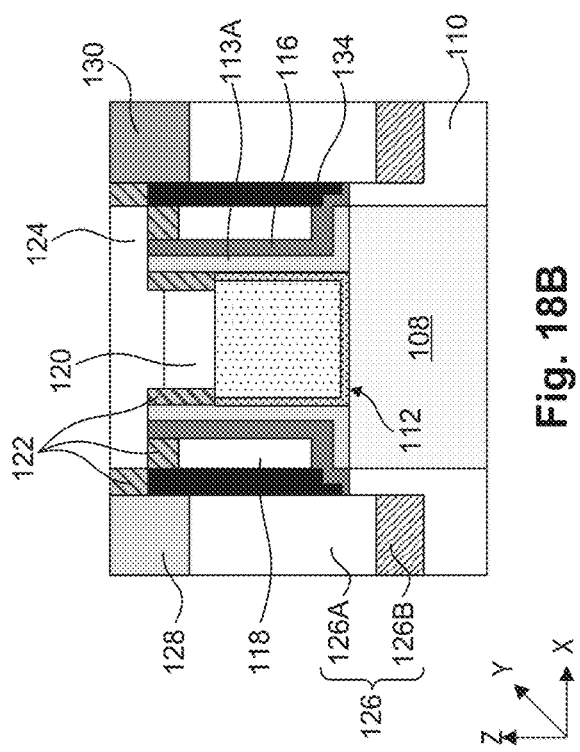

In some embodiments, the structures of FIGS. 18A-18C with air spacer seals 122 disposed on gate structure 112 can be formed if sacrificial cap 720 is removed instead of etching back during the formation of air spacers 118 in operation 230.

The present disclosure provides example semiconductor devices (e.g., semiconductor device 100) with FETs (e.g., FET 102A or GAA FET 102A) having air spacers (e.g., air spacers 118) and air caps (e.g., air cap 120) and provides example methods (e.g., method 200) of forming such semiconductor devices. In some embodiments, the air spacers can be disposed between the sidewalls of gate structures (e.g., gate structure 112) and S/D contact structures (e.g., S/D contact structures 126) and can extend along the width of the gate structures. In some embodiments, the air caps can be disposed between the conductive structures (e.g., metal line 142) of the interconnect structures and the underlying top surfaces of the gate structures. The air spacers and air caps provide electrical isolation between the gate structures and the S/D contact structures and/or between the gate structures and the interconnect structures with improved device reliability and performance. The low dielectric constant of air in air spacers and air caps can reduce the parasitic capacitance by about 20% to about 50% compared to semiconductor devices without air spacers and air caps. Further, the presence of air spacers and air caps minimizes current leakage paths between the gate structures and the S/D contact structures and/or between the gate structures and the interconnect structures. Reducing the parasitic capacitance and/or current leakage in the semiconductor devices can improve the device reliability and performance compared to semiconductor devices without air spacers and air caps.

In some embodiments, a semiconductor device includes a substrate and a fin structure disposed on the substrate. The fin structure includes a first fin portion and a second fin portion. The semiconductor device further includes a source/drain (S/D) region disposed on the first fin portion, a contact structure disposed on the S/D region, a gate structure disposed on the second fin portion, an air spacer disposed between a sidewall of the gate structure and the contact structure, a cap seal disposed on the gate structure, and an air cap disposed between a top surface of the gate structure and the cap seal.

In some embodiments, a semiconductor device includes a substrate, a fin structure with first and second fin portions disposed on the substrate, a nanostructured channel region disposed on the first fin portion, a gate-all-around (GAA) structure surrounding the nanostructured channel region, a source/drain (S/D) region disposed on the second fin portion, an interlayer dielectric (ILD) layer disposed on the S/D region, an air spacer disposed between the gate structure and the ILD layer, a cap seal disposed on the gate structure, wherein top surfaces of the cap seal and the ILD layer are substantially coplanar with each other, and an air cap disposed between a top surface of the gate structure and the cap seal.

In some embodiments, a method includes forming a polysilicon structure on a fin structure, forming an epitaxial region on the fin structure, replacing the polysilicon structure with a gate structure, forming a contact structure on the epitaxial region, forming an air spacer between the gate structure and the contact structure, forming a spacer seal on the air spacer, forming an air cap on the gate structure, and forming a cap seal on the air cap and the spacer seal.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate;
    a fin structure disposed on the substrate, wherein the fin structure comprises a first fin portion and a second fin portion;
    a source/drain (S/D) region disposed on the first fin portion;
    a contact structure disposed on the sir) region;
    a gate structure disposed on the second fin portion;
    an air spacer disposed between a sidewall of the gate structure and the contact structure;
    a cap seal disposed on the gate structure; and
    an air cap disposed between a top surface of the gate structure and the cap seal, wherein an air-filled cavity of the air cap is in contact with the top surface of the gate structure.

2. The semiconductor device of claim 1, further comprising a spacer seal disposed between the cap seal and the air spacer.

3. The semiconductor device of claim 1, further comprising a spacer seal disposed between the cap seal and the air cap.

4. The semiconductor device of claim 1, further comprising an etch stop layer (ESL) disposed on the S/D region and along a sidewall of the contact structure, wherein the air spacer is disposed between the ESL and a sidewall of the gate structure.

5. The semiconductor device of claim 1, further comprising a spacer with a first spacer portion disposed between the air spacer and the gate structure and a second spacer portion disposed on the SID region.

6. The semiconductor device of claim 1, further comprising:
    a via structure disposed on the contact structure; and
    a spacer seal disposed on the air spacer, wherein top surfaces of the spacer seal and the via structure are substantially coplanar with each other.

7. The semiconductor device of claim 1, further comprising:
    a capping layer disposed on the contact structure; and
    a spacer seal disposed on the air spacer, wherein top surfaces of the spacer seal and the capping layer are substantially coplanar with each other.

8. The semiconductor device of claim 1, further comprising a spacer seal disposed between the sidewall of the gate structure and the contact structure, wherein the spacer seal surrounds the air spacer.

9. The semiconductor device of claim 1, wherein a vertical dimension of the air spacer is greater than a vertical dimension of the gate structure.

10. The semiconductor device of claim 1, further comprising a via structure disposed on the contact structure, wherein top surfaces of the cap seal and the via structure are substantially coplanar with each other.

11. A semiconductor device, comprising:
    a substrate;
    a fin structure with first and second fin portions disposed on the substrate;
    a nanostructured channel region disposed on the first fin portion;

a gate-all-around (GAA) structure surrounding the nanostructured channel region;

a source/drain (S/D) region disposed on the second fin portion;

air interlayer dielectric (ILD) layer disposed on the S/D region;

an air spacer disposed between the gate structure and the ILD layer;

a cap seal disposed on the gate structure, wherein top surfaces of the cap seal and the ILD layer are substantially coplanar with each other; and an air cap disposed between a top surface of the gate structure and the cap seat wherein an air-filled cavity of the air cap separates the top surface of the gate structure from a bottom surface of the cap seal.

12. The semiconductor device of claim 11, further comprising a spacer seal with a first seal portion disposed between the cap seal and the ILD layer and a second seal portion disposed between the cap seal and the air spacer.

13. The semiconductor device of claim 11, further comprising an etch stop layer (ESL) disposed along a sidewall of the ILD layer, wherein the air spacer is disposed between the ESL and the gate structure.

14. The semiconductor device of claim 11, wherein a vertical dimension of the air cap is greater than a vertical dimension of the cap seal.

15. A semiconductor structure, comprising:

a substrate;

a fin structure disposed on the substrate, wherein the fin structure comprises a first fin portion and a second fin portion;

a source/drain (S/D) region disposed on the first fin portion;

a first dielectric layer disposed on the sir) region;

a gate structure disposed on the second fin portion;

a first air gap disposed between the gate structure and the first dielectric layer;

a second dielectric layer disposed on the gate structure; and a second air gap disposed between a top surface of the gate structure and the second dielectric layer wherein the second air gap has a rectangular-shaped cross-sectional profile.

16. The semiconductor structure of claim 15, further comprising a third dielectric layer disposed on the first air gap and between the gate structure and the first dielectric layer.

17. The semiconductor structure of claim 15, further comprising a third dielectric layer disposed between the first air gap and the second dielectric layer.

18. The semiconductor structure of claim 15, further comprising a third dielectric layer disposed on the first air gap and between the first dielectric layer and the second dielectric layer.

19. The semiconductor structure of claim 15, wherein a vertical dimension of the first air gap is greater than a vertical dimension of the gate structure.

20. The semiconductor structure of claim 15, further comprising a stack of semiconductor layers disposed on the second fin portion, wherein the gate structure surrounds each of the semiconductor layers.

* * * * *